(12) United States Patent  
Nishi

(10) Patent No.: US 6,667,796 B1  
(45) Date of Patent: Dec. 23, 2003

(54) EXPOSURE METHOD AND APPARATUS

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 67 days.

(21) Appl. No.: 09/712,843

(22) Filed: Nov. 15, 2000

Related U.S. Application Data

(63) Continuation of application No. PCT/JP99/02498, filed on May 14, 1999.

(30) Foreign Application Priority Data

May 15, 1998 (JP) .............................................. 10-133343

(51) Int. Cl.$^7$ ........................ G03B 27/52; G03B 27/42; G01B 11/00; G03G 15/00
(52) U.S. Cl. ............................. 355/30; 355/53; 355/67; 355/68; 359/362; 356/399; 399/4; 399/32; 399/51
(58) Field of Search .............................. 355/30, 53, 67, 355/68; 359/362; 356/399; 399/4, 32, 51

(56) References Cited

U.S. PATENT DOCUMENTS

| | | | |
|---|---|---|---|
| 4,666,273 A | * | 5/1987 | Shimizu et al. |
| 4,690,528 A | | 9/1987 | Tanimoto et al. |
| 4,699,505 A | | 10/1987 | Komoriya et al. |
| 4,780,747 A | * | 10/1988 | Suzuki et al. |
| 4,920,505 A | * | 4/1990 | Suzuki |
| 4,989,031 A | | 1/1991 | Kamiya |
| 5,337,097 A | * | 8/1994 | Suzuki et al. |
| 5,467,637 A | | 11/1995 | Hasegawa et al. |
| 5,559,338 A | | 9/1996 | Elliott et al. |
| 5,559,584 A | | 9/1996 | Miyaji et al. |
| 5,581,324 A | * | 12/1996 | Miyai et al. |
| 5,650,877 A | | 7/1997 | Phillips, Jr. et al. |
| 5,696,623 A | * | 12/1997 | Fujie et al. |
| 5,852,518 A | | 12/1998 | Hatasawa et al. |
| 5,883,704 A | | 3/1999 | Nishi et al. |
| 5,973,863 A | | 10/1999 | Hatasawa et al. |
| 6,310,679 B1 | | 10/2001 | Shiraishi |

FOREIGN PATENT DOCUMENTS

| | | |
|---|---|---|
| EP | 1 075 017 A1 | 7/2001 |
| JP | A 61-79228 | 4/1986 |
| JP | A 5-210049 | 8/1993 |
| JP | A 6-242084 | 9/1994 |
| JP | A 9-50954 | 2/1997 |
| JP | A 9-246140 | 9/1997 |
| JP | A 9-312256 | 12/1997 |
| JP | A 10-54932 | 2/1998 |
| JP | A 10-104513 | 4/1998 |
| JP | A 11-66769 | 3/1999 |
| WO | WO99/27570 | 3/1999 |
| WO | WO 00/39623 | 7/2000 |

OTHER PUBLICATIONS

U.S. patent application Ser. No. 08/813,968.

* cited by examiner

*Primary Examiner*—Frank G. Font  
*Assistant Examiner*—Khaled Brown  
(74) *Attorney, Agent, or Firm*—Oliff & Berridge, PLC

(57) ABSTRACT

A pattern of a reticle is irradiated with excimer laser light to expose an image of the pattern of the reticle onto a wafer through a projection optical system. Driving elements for driving optical elements in the projection optical system and a transfer mechanism for transferring a pupil filter into the projection optical system are covered by covers to isolate the inside of the projection optical system from its outside. During exposure, helium gas is supplied to the inside of the projection optical system with a purity and a temperature of the helium gas being continuously monitored and the purity and the temperature of the helium gas in the projection optical system being maintained within a predetermined tolerance range based upon the monitored results.

25 Claims, 10 Drawing Sheets

EXPOSURE METHOD AND APPARATUS

BACKGROUND OF THE INVENTION

1. Field of the Invention

The present invention relates to an exposure method and an exposure apparatus, and more particularly, to an exposure method and an exposure apparatus used when a mask pattern is transferred onto a light-sensitive substrate during a photo lithography process for producing semiconductor devices, image pickup devices (CCDs etc.), liquid crystal display devices, plasma displays, thin film magnetic heads and the like. The present invention is suitably used for the exposure apparatus using ultraviolet light such as an excimer laser or the like as an exposure beam.

2. Description of the Related Art

As an integrated circuit is further reduced in size, in a full field exposure type projection exposure apparatus such as a stepper or a scan and exposure type projection exposure apparatus such as a step-and-scan apparatus, it is required to enhance resolution. One method for enhancing the resolution is to shorten the wavelength of illumination light (exposure light) for exposure. For this reason, the wavelength of exposure used for a projection exposure apparatus is shortened year after year. The currently mainstream exposure light is KrF excimer laser light (wavelength of 248 nm). At the present, ArF excimer laser light (wavelength of 193 nm) of shorter wavelength and $F_2$ laser light (wavelength of 157 nm) are also under test. Harmonics of metal vapor laser light and YAG laser light and the like are also under test.

As excimer laser light sources used as exposure light sources, there are a narrow-band laser light source in which the full width at half maximum of a spectrum of the laser light is 2 to 3 pm or smaller, and a broadened-band laser light source in which the full width at half maximum of a spectrum of the laser light is 100 pm or more. When illumination light having short wavelength equal to or shorter than ultraviolet region such as excimer laser light is used as exposure light, only quartz ($SiO_2$) and fluorite ($CaF_2$) are presently known as a glass material for refractor having practical transmittance, and the narrow-band laser light source has an advantage of being easy to carry out achromatization of a projection optical system as compared with the broadened-band laser light source. However, the band of the excimer laser light is originally broadened band, and in order to use the excimer laser as the narrow-band laser light source, it is necessary to carry out injection-locking or the like for narrowing the band of the oscillation spectrum, and the broadened-band laser light source has advantages in terms of laser output, durability (life), and manufacturing cost. Therefore, attempts are recently made for the projection optical system to have a structure in which achromatization is easily carried out, so that the broadened-band laser source can be used.

That is, as a projection optical system used for a projection exposure apparatus, there are a refracting-type projection optical system comprised of a plurality of refractors alone, and a catadioptric projection optical system such as disclosed in Japanese Patent Application Laid-open No. 6-132191 comprising a combination of a catadioptric element such as a concave mirror and refractors. In the former refracting projection optical system, a proportion of lenses made of fluorite is increased to broaden an achromatic width, thereby making it possible to use the broadened-band laser light source. In the latter catadioptric projection optical system, since the concave mirror disposed between the refractors has no chromatic aberration and it is easy to achromatize, and it is possible to use the broadened-band laser light source.

In recent years, a pattern steps tends to move from on the order of conventional 1 $\mu$m to 0.1 $\mu$m or less with CMP technique (Chemical Mechanical Polishing) which flattens a surface of a wafer. A film thickness of a resist can also be made thinner in accordance with this trend. Therefore, when a projection optical system having the numerical aperture of 0.7 or more is used for example, it is possible to obtain a resolution of about 80 to 130 nm. In the case of the catadioptric projection optical system, if a narrow-band ArF excimer laser light having a full width at half maximum of about 0.5 to 1 pm is used for example, it has been found that it is possible to design an optical system having a maximum effective field diameter of a lens of about 300 mm and numerical aperture of 0.7 or more by using several aspheric optical elements.

As described above, laser light in a far ultraviolet region such as an ArF excimer laser is used in a recent projection exposure apparatus so as to enhance the resolution. However, ultraviolet light is originally absorbed by ozone ($O_3$) and if the wavelength becomes about 200 nm or shorter, the absorption amount of the light by oxygen ($O_2$) is increased. Thereupon, when the laser light of such an ultraviolet region is used, it is preferable that a gas having a low absorptance with respect to ultraviolet light and having no effect on photoresist such as an ozone-free air or a nitrogen ($N_2$) gas is circulated on the optical path in the illuminating optical system or projection optical system to suppress the reduction in exposure amount. However, since the nitrogen gas has a high index of refraction, when the nitrogen gas is circulated in the projection optical system, the index of refraction is varied by a slight variation in temperature or pressure and the projection image is wandered, resulting in an inconvenience that the exposure precision (superposing precision or the like) is lowered. Especially in a catadioptric projection optical system designed to have a numerical aperture of 0.7 or greater, even though the number of lenses is as small as 15 to 25, since a distance between a reticle and a wafer is long, space between lenses is great, and a wandering effect on the projection image due to temperature variation is increased.

In order to suppress the wandering of the projection image, it is effective that a gas such as helium (He) having a small index of refraction as small as about ⅛ of that of nitrogen gas and having small variation amount thereof is circulated in the projection optical system. However, the projection optical system is provided with a driving mechanism for driving predetermined lens or the like for excellently keeping the image-forming characteristics, and with an opening for bringing in and out an optical filter or the like which was optimized with respect to the pattern shape. Since inside and outside of the projection optical system are not completely insulated from each other, it was difficult to constantly keep purity of the helium gas in the projection optical system and to maintain excellent image-forming characteristics. Further, it may be possible to keep supplying helium gas so that the pressure of the helium gas becomes positive pressure with respect to the pressure outside the projection optical system, thereby constantly keeping the purity of the helium gas in the projection optical system. However, since the helium gas is expensive under present circumstances, there is an inconvenience that if the flow rate of the helium gas is increased in this manner, working cost is increased.

SUMMARY OF THE INVENTION

In view of the above circumstances, it is a first object of the present invention to provide an exposure method capable of suppressing deterioration in image-forming characteristics due to variation in a temperature or a purity of a gas in a projection optical system, and capable of maintaining excellent image-forming characteristics. It is a second object of the present invention to provide an exposure method capable of preventing the transmittance of an exposure beam in a projection optical system from being lowered, or capable of suppressing the deterioration in image-forming characteristics. Further, it is another object of the present invention to provide an exposure apparatus capable of carrying out the above-described exposure methods.

According to a first aspect of the present invention, there is provided an exposure method, comprising:

irradiating a pattern of a mask with an exposure beam to expose an image of the pattern of the mask onto a substrate through a projection optical system, there being provided an image-forming characteristics control member which controls predetermined image-forming characteristics of the projection optical system by driving a predetermined optical member in the projection optical system, and an isolating member which isolates the image-forming characteristics control member from outside air of the projection optical system, and supplying a gas through which the exposure beam is allowed to pass into the isolating member and around the optical member during the exposure.

According to the above-mentioned exposure method according to the first aspect of the present invention, air-tightness of the interior of the projection optical system is enhanced by providing the isolating member which isolates the image-forming characteristics control member which controls the predetermined image-forming characteristics of the projection optical system from outside air of the projection optical system. Therefore, when a gas through which the exposure beam is allowed to pass is supplied to the inside of the isolating member and around the optical member during exposure, a variation in a temperature of a purity of the gas in the projection optical system is reduced, and as a result, it is possible to suppress the deterioration of the image-forming characteristics and to maintain the excellent image-forming characteristics.

According to a second aspect of the present invention, there is provided an exposure method wherein a pattern of a mask is irradiated with an exposure beam to expose an image of the pattern of the mask onto a substrate through a projection optical system, comprising:

supplying a gas through which the exposure beam is allowed to pass to at least a portion of an optical path of the exposure beam in the projection optical system, detecting at least one of a purity and a temperature of the gas in the projection optical system, and maintaining at least one of the purity and the temperature of the gas in the projection optical system within a predetermined tolerance range based on a result of the detection.

According to the above-mentioned exposure method according to the second aspect of the present invention, at least one of the purity and the temperature of the gas having an excellent transmittance in the projection optical system is substantially continuously measured, that is, at least one of them is successively measured at a predetermined sampling rate for example, and based on a result of this measurement, at least the one of the purity and the temperature is continuously maintained within the predetermined tolerance range. Therefore, it is possible to prevent transmittance from being lowered with respect to the exposure beam in the projection optical system, or to suppress the deterioration of the image-forming characteristics. Further, when the temperature of the gas is adjusted, it is possible to collect heat generated by exposure by utilizing the gas as a heat exchange medium, and it is also possible to adjust a temperature in the projection optical system.

According to a third aspect of the present invention, there is provided an exposure apparatus which irradiates a pattern of a mask with an exposure beam to expose an image of the pattern of the mask onto a substrate through a projection optical system, comprising:

an image-forming characteristics control member which controls predetermined image-forming characteristics of the projection optical system;

an isolating member which isolates the image-forming characteristics control member from outside air of the projection optical system; and a gas supply system which supplies a gas through which the exposure beam is allowed to pass into the isolating member and around the optical member.

According to the above-mentioned exposure apparatus according to the third aspect of the present invention, the exposure method according to the first aspect of the present invention can be carried out, and exposure with high precision can be performed with the deterioration being suppressed of the image-forming characteristics that may be caused due to variation in a temperature or a purity of a gas in a projection optical system.

According to a fourth aspect of the present invention, three is provided an exposure apparatus which irradiates a pattern of a mask with an exposure beam to expose an image of the pattern of the mask into a substrate through a projection optical system, comprising:

a gas supply apparatus which supplies a gas through which the exposure beam is allowed to pass to at least a portion of an optical path of the exposure beam in the projection optical system; and a sensor which substantially continuously detects at least one of a purity and a temperature of the gas in the projection optical system, wherein the gas supply apparatus is driven based on a detection result of the sensor to maintain at least one of the purity and the temperature of the gas in the projection optical system within a predetermined tolerance range. With this exposure apparatus, the exposure method according to the second aspect of the present invention can be carried out.

According to a fifth aspect of the present invention, there is provided an exposure apparatus which irradiates a mask with an exposure beam emitted from a light source to expose a substrate with the exposure beam through the mask, comprising:

an adjustment apparatus which moves at least one optical element in an optical system disposed between the light source and the substrate to adjust optical characteristics of the optical system;

an isolating member which isolates at least a portion of the adjustment apparatus from outside air; and a gas supply system which supplies a gas through which the exposure beam is allowed to pass into the isolating member. With this exposure apparatus, the exposure method according to the first aspect of the present invention can be substantially carried out.

According to a sixth aspect of the present invention, there is provided a method for manufacturing a device, comprising:

a step of transferring a device pattern (mask pattern) onto a work piece (substrate) using the exposure method according to the first or second aspect of the present invention.

According to a seventh aspect of the present invention, there is provided an exposure apparatus which irradiates a mask with an exposure beam emitted from a light source to expose a substrate with the exposure beam through the mask, comprising:

a driving mechanism which drives at least one optical element in an optical system disposed between the light source and the substrate;

a gas supply system which supplies a gas through which the exposure beam is allowed to pass to an optical path in the optical system; and a gas discharge system which discharges the gas supplied into the optical system through a periphery of the driving mechanism.

According to a eighth aspect of the present invention, there is provided an exposure apparatus which irradiates a mask with an exposure beam emitted from a light source to expose a substrate with the exposure beam through the mask, comprising:

a driving mechanism which drives at least one optical element in an optical system disposed between the light source and the substrate, and a cover which cuts off communication established by the driving mechanism between an interior of the optical system and outside air of the optical system.

According to a ninth aspect of the present invention, there is provided an exposure method wherein a mask is irradiated with an exposure beam emitted from a light source to expose a substrate with the exposure beam through the mask, comprising:

supplying a gas through which the exposure beam is allowed to pass to an optical path in an optical system disposed between the light source and the substrate, and discharging the gas through a periphery of a driving mechanism which drives at least one optical element in the optical system.

According to a tenth aspect of the present invention, there is provided a manufacturing method for an exposure apparatus wherein a mask is irradiated with an exposure beam emitted from a light source to expose a substrate with the exposure beam through the mask, comprising:

disposing at least one optical element in an optical system disposed between the light source and the substrate in a lens barrel, disposing a driving mechanism which drives the optical element on a side face of the lens barrel, and mounting a cover which covers at least a portion of the driving mechanism on the side face of the lens barrel.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

One example of a preferred embodiment of projection exposure apparatus according to the present invention will be described below with reference to the accompanying drawings. In this embodiment, the present invention is applied to a step-and-scan type projection exposure apparatus which uses a catadioptric projection optical system, and performs exposure by synchronously scanning a reticle and a wafer.

Figure 1:
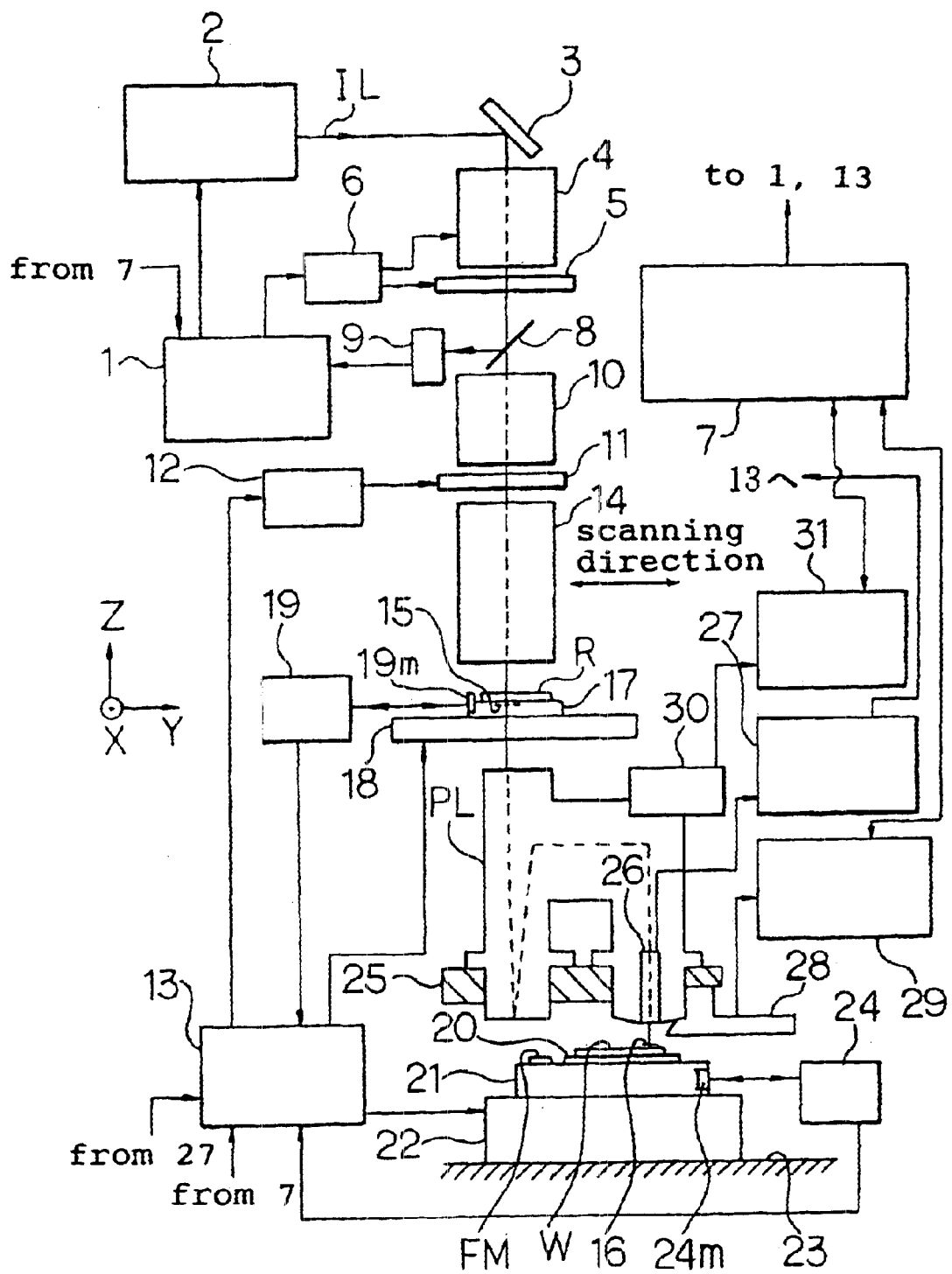
FIG. 1 is a schematic block diagram showing a projection exposure apparatus used in one example of an embodiment of the present invention.

FIG. 1 schematically shows the arrangement of a projection exposure apparatus according to this embodiment. In FIG. 1, an exposure controller 1 controls the emission condition of an excimer laser light source 2. An illuminating light IL for exposure composed of ultraviolet pulsed laser light emitted from the excimer laser light source 2 is deflected by a deflection mirror 3 to reach a first illumination system 4. In this embodiment, as the excimer laser light source 2, a narrow-band laser light source of ArP excimer laser (wavelength of 193 nm) in which the full width at half maximum of its oscillation spectrum is narrowed to 1 pm or less is used. It should be, however, noted that an emission-line lamp such as a mercury lamp, a KrP excimer laser light source (wavelength of 248 nm), an $F_2$ laser light source (wavelength of 157 nm), an $Ar_2$ laser light source (wavelength of 126 nm), a metal vapor laser light source, a harmonics generator of YAG laser light or the like may also be used as a light source for exposure.

The first illumination system 4 includes a beam expander, a light quantity varying mechanism, an illumination switching mechanism for switching the amounts of illuminating light from one to another when the coherence factor (so-called σ value) of the illumination optical system is changed, a fly's-eye lens and the like. The first illumination system 4 forms a two-dimensionally distributed secondary light source of the illuminating light IL on an exit plane thereof. A switching revolver 5 for an illumination system aperture stop is disposed in the plane where the secondary light sources are formed. The switching revolver 5 is used to switch over various illumination conditions from one to another. The switching revolver 5 is provided in a side face thereof with various aperture stops such as an ordinary circular aperture stop, an aperture stop for so-called modified illumination which is composed of a plurality of apertures decentered from the optical axis, an annular-zone-shaped aperture stop, and an aperture stop for small σ value which consists of a small circular aperture. Thus, a desired illumination system aperture stop (σ stop) can be disposed in the exit plane of the first illumination system 4 by revolving the switching revolver 5 through a switching device 6.

When illumination system aperture stops are switched over from one to another as stated above, the illumination switching mechanism in the first illumination system 4 is synchronously switched through the switching device 6 so that the light quantity is maximized.

The operation of the switching device 6 is controlled by the exposure controller 1. The operation of the exposure controller 1 is controlled by a main controller 7 which centrally operations of the whole apparatus.

The illuminating light IL passing through an illumination system aperture stop set by the switching revolver 5 enters a beam splitter 8 having a high transmittance and a low reflectivity. The illuminating light reflected by the beam splitter 8 is received by an integrator sensor 9 including a photoelectric detector such as a photodiode. The integrator sensor 9 photoelectrically converts the received illuminating light to obtain a detection signal, and the signal is supplied to the exposure controller 1. The relationship between the detection signal and the exposure amount (illuminance) on the surface of a water has been previously measured and stored. The exposure controller 1 monitors the integral of the exposure amount on the surface of the wafer from the detection signal. The detection signal is also used to normalize output signals from various sensors which use the exposure illuminating light IL.

The illuminating light IL passing through the beam splitter 8 illuminates an illumination field stop system (reticle blind system) 11 through a second illumination system 10. A plane where the illumination field stop system 11 is placed is conjugate with the entrance plane of the fly's-eye lens in the first illumination system 4. The illumination field stop system 11 is illuminated with an illumination area approximately similar in sectional configuration to each lens element of the fly's-eye lens. The illumination field stop system 11 is divided into a movable blind and a fixed blind. The fixed blind is a field stop having a fixed rectangular aperture. The movable blind comprises two pairs of movable blades capable of being opened and closed and also capable of moving in a recticle scanning direction and a non-scanning direction independently of each other. The fixed blind determines a configuration of an illumination area on a reticle, and the movable blind performs an operation of gradually opening the cover of the aperture of the fixed blind at the time of starting scanning exposure and also performs an operation of gradually closing the cover at the time of terminating the scanning exposure. Thus, areas on a wafer other than a proper shot area to be exposed are prevented from being illuminated by the illuminating light.

The operation of the movable blind in the illumination field stop system 11 is controlled by a driver 12. When synchronous scanning of a reticle and a wafer is carried out by a stage controller 13 as described later, the stage controller 13 synchronously drives the movable blind through the driver 12.

The illuminating light IL passing through the illumination field stop system 11 passes through a third illumination system 14 and illuminates a rectangular illumination area 15 on a pattern surface (lower surface) of a reticle R with a uniform illuminance distribution. A plane where the fixed bind of the illumination field stop system 11 is placed apart from a plane which is conjugated with the pattern surface of the recticle R, so that an illumination distribution of the illumination light with respect to the scanning direction thereof has a predetermined slope at its end on the reticle and on the wafer. The configuration of the illumination area 15 is determined by the aperture of the fixed blind.

In the following description, an X-axis is taken in a direction perpendicular to the plane of FIG. 1 in a plane parallel to the pattern surface of the recticle R, a Y-axis is taken in a direction parallel to the plane of FIG. 1, and a Z-axis is taken in a direction perpendicular to the pattern surface of the reticle R. Under these conditions, the illumination area 15 on the reticle R is a rectangular area longer in the direction X. During scanning exposure, the reticle R is scanned in the direction of +Y or −Y with respect to the illumination area 15. In other words, the scanning direction is set in the direction Y.

An image of a pattern in the illumination area 15 on the reticle R is projected onto an exposure area 16 on a wafer W as a demagnified image through a projection optical system PL, which is telecentric on both sides (or on the wafer side only), with a projection magnification β (β is ¼, ⅕ or ⅙, for example).

The reticle R is held on a reticle stage 17. The reticle stage 17 is mounted through an air bearing on a guide extending in the direction Y on a reticle support 18. The reticle stage 17 is capable of scanning across the reticle support 18 in the direction Y at a constant speed by the operation of a linear motor, and has an adjusting mechanism capable of adjusting the position of the reticle R in the directions X and Y and also in the direction of rotation. The position of the reticle stage 17 (reticle R) in each of the directions X and Y is constantly measured at a resolution of on the order of 1 nm by a combination of a moving mirror 19m secured to an end portion of the reticle stage 17 and a laser interferometer 19 secured to a column 34 (See FIG. 9), which will be described below. The angle of rotation of the reticle stage 17 is also measured by the combination of the moving mirror 19m and the laser interferometer 19. The measured values are supplied to the stage controller 13. The steps controller 13 controls the operation of the linear motor, etc. on the reticle support 18 according to the measured values supplied thereto.

The wafer W is held through a wafer holder 20 on a sample table 21. The sample table 21 is mounted on a wafer stage 22. The wafer stage 22 is mounted through an air bearing on a guide over a surface plate 23. The wafer stage 22 is arranged so as to be capable of scanning at a constant speed and stepping in the direction Y and also stepping in the direction X over the surface plate 23 by the operation of a linear motor. The wafer stage 22 has a Z-stage mechanism and a tilt mechanism (leveling mechanisms) incorporated therein. The Z-stage mechanism causes the sample table 21 to move in the direction Z within a predetermined range. The tilt mechanism adjusts the tilt angle of the sample table 21.

Figure 9:
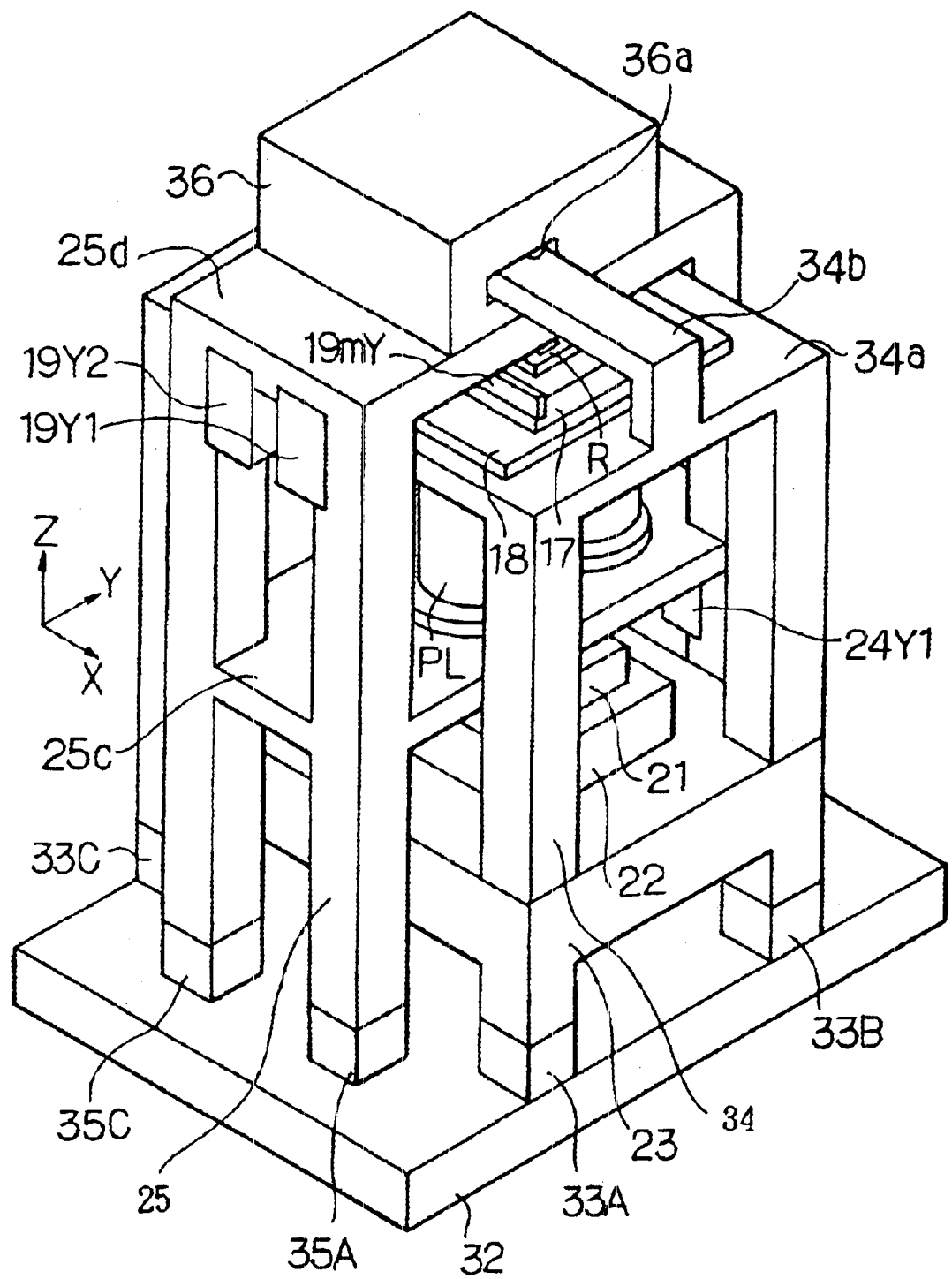
FIG. 9 is a perspective view showing a support structure of a mechanism portion of the projection exposure apparatus used in the embodiment of the present invention.

The position of the same table 21 (wafer W) in each of the directions X and Y is constantly measured at a resolution of on the order of 1 nm by a combination of a moving mirror 24m secured to a side face of the sample table 21 and a laser interferometer 24 secured to a column 34 (See FIG. 9). The rotation angle and tilt angle of the sample table 21 are also measured by the combination of the moving mirror 24m and the laser interferometer 24. The measured values are supplied to the stage controller 13. The stage controller 13 controls the operation of the linear motor, etc. for driving the wafer stage 22 according to the measured values supplied thereto.

To carry out scanning exposure, the main controller 7 sends an exposure start command to the stage controller 13. In response to the command, the stage controller 13 causes the reticle R to be scanned to the direction +Y (or the direction −Y) at a speed $V_a$ through the reticle stage 17 and also causes the wafer W to be scanned to the direction −Y (or the direction +Y) at a speed $V_W$ through the wafer stage 22 synchronously with the scanning of the reticle R. The scanning speed $V_W$ of the wafer W is set at $\beta \cdot v_x$ by using the projection magnification $\beta$ from the reticle R to the wafer W.

The projection optical system PL is held on an intermediate plate 25c of a column 25 (See FIG. 9) stood on an outside base member. An oblique incidence multipoint autofocus sensor (hereinafter referred to as "AF sensor") 26 is disposed on a side face of the projection optical system PL which faces in the direction X. The AF sensor 26 obliquely projects a slit image or the like onto a plurality of measuring points on the surface of the wafer W and outputs a plurality of focus signals corresponding to positions (focus positions) of the wafer surface in the direction Z at the measuring points. The focus signals from the multipoint AP sensor 26 are supplied to a focus-tilt controller 27. The focus-tilt controller 27 obtains a focus position and tilt angle of the surface of the wafer W from the focus signals and supplies the results thus obtained to the stage controller 13.

The stage controller 13 drives the Z-stage mechanism and tilt mechanism in the wafer stage 22 by a servo system such that the supplied focus position and tilt angle respectively coincide with the focus position and tilt angle of the image-formation plane of the projection optical system PL, which have previously been obtained. Thus, the surface of the wafer W within the exposure area 16 is controlled by autofocus and autoleveling system such that the wafer surface coincides with the image-formation plane of the projection optical system PL even during scanning exposure.

Further, an off-axis alignment sensor 28 is secured to the side face of the projection optical system PL which faces in the direction +Y. During alignment, the alignment sensor 28 detects the position of a wafer mark for alignment attached to each shot area on the wafer W, and supplies a detection signal to an alignment signal processor 29. The alignment signal processor 29 is also supplied with the measured values from the laser interferometer 24. The alignment signal processor 29 calculates coordinates in a stage coordinate system (X, Y) of a wafer mark to a be detected from the detection signal and the measured values from the laser interferometer 24, and supplies the calculated coordinates to the main controller 7. The term "stage coordinate system (X, Y)" means a coordinate system determined on the basis of the X- and Y-coordinates of the sample table 21 measured by the laser interferometer 24. The main controller 7 obtains array coordinates in the stage coordinate system (X, Y) of each shot area on the wafer W from the supplied coordinates of the associated wafer mark, and supplies the array coordinates to the stage controller 13. The stage controller 13 controls the position of the wafer stage 22 when scanning exposure is carried out for each shot area on the basis of the array coordinates supplied thereto.

A fiducial mark member FM is secured to the sample table 21. The fiducial mark member FM is provided on the surface thereof with various fiducial marks serving as position references for the alignment sensor 28 and a reference reflecting surface serving as a reference of the reflectivity of the wafer W.

The projection optical system PL of the present embodiment is provided with a lens driving mechanism 30 for driving a plurality of corresponding optical members for correcting predetermined image-forming characteristics. The lens driving mechanism 30 is a representative of a plurality of lens driving mechanisms as will be described later. An image correcting apparatus 31 drives the lens driving mechanism 30 under control of the main controller 7.

In the present embodiment, an ArF excimer laser light is used as the illuminating light IL. In the case of such laser light in the far ultraviolet region, the light is absorbed largely not only by ozone, but also by oxygen. Thereupon, in order to prevent illuminance of the illuminating light IL on a wafer from being lowered, helium gas having a small variation amount of index of refraction is supplied into the projection optical system PL according to the present embodiment. Since the helium gas is expensive, dry air (e.g., air having humidity of 5% or less) containing extremely small amount of nitrogen gas or ozone is supplied to the other optical paths.

Next, the arrangement of the projection optical system PL according to this embodiment will be described in detail with reference to FIG. 2.

Figure 2:
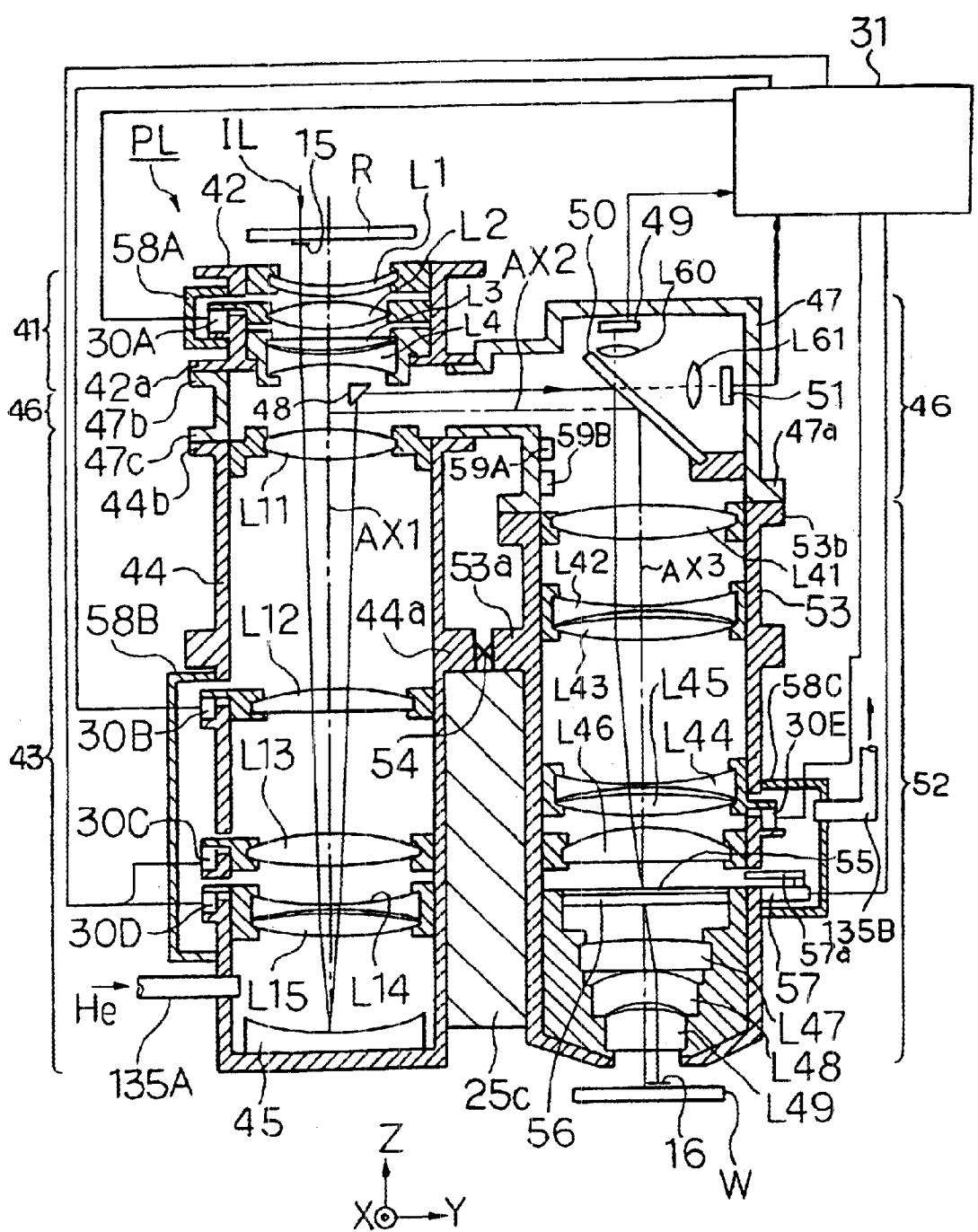
FIG. 2 is a sectional view showing a structure of a projection optical system PL shown in FIG. 1.

FIG. 2 is a sectional view showing the projection optical system PL shown in FIG. 1. In FIG. 2, the projection optical system PL mechanically includes four portions, i.e. a first objective portion 41, an optical axis turn portion 43, an optical axis deflecting portion 46, and a second objective portion 52. A concave mirror 45 is disposed in the optical axis turn portion 43.

Further, in order to replace gas in the projection optical system PL by helium gas, there are provided a piping 135A for supplying the helium gas into the projection optical system PL and a piping 135B for discharging gas (helium gas or the like having reduced purity) in the projection optical system PL. Purity and temperature of the helium gas in the projection optical system PL are continuously respectively measured by a helium gas purity sensor (oxygen densitometer can also be used, for example) 59A and a temperature sensor 59B, that is, they are continuously measured at a predetermined sampling rate. The sampling rate set shorter than a minimum time period during which the purity or temperature of the gas can be judged as being substantially varied experimentally during exposure for example. Based on result of detection of the sensors 59A and 59B, flow rate and temperature of the helium gas to be supplied into the projection optical system PL are controlled.

However, when illuminating light in the ultraviolet region having a wavelength of about 300 nm or shorter, such as ArF excimer laser light, is used as in this embodiment, vitreous materials usable for refracting lenses in the projection optical system PL are limited to such materials as quartz ($SiO_2$) and fluorite ($CaF_2$). Therefore, depending upon required specifications (resolving power, depth of focus, field sine and the like); for example, it is difficult to design the projection optical system PL using only a refracting optical system. For this reason, in this embodiment, high NA is effected by jointly using a refracting optical system and a reflecting optical system such as a concave mirror, in which no chromatic aberration is produced. However, a general reflecting optical is a 1:1 optical system (with a magnification ratio of 1:1). Therefore, when reduction projection with a demagnification ratio of ¼ or ⅕ is performed as in this embodiment, it is necessary to devise a special scheme for the arrangement of the optical system as stated below.

First, the first objective portion 41 is disposed directly below the reticle R. The first objective portion 41 includes lenses L1, L2, L3 and L4 in this order from the reticle R side. The lenses L1, L2, L3 and L4 are secured in a lens barrel 42 through lens frames.

A side face of the lens barrel 42 is provided at its three portions with extensible driving elements 30A comprising piezoelectric elements and the like for adjusting a position and an inclining angle of the lens L2 in the direction Z. A lens driving mechanism including the driving elements 30A is covered with a cover 5BA and sealed.

Below the lens barrel 42, a lens barrel 44 of the optical axis turn portion 43 is disposed through a lens barrel 47 of the optical axis deflecting portion 46. The optical axis turn portion 43 includes lenses L11, L12, . . . , L20 and L21 and a concave mirror 45, in this order from the reticle R side, which are secured in the lens barrel 44 through lens frames.

A side face of the lens barrel 44 is also provided with extensible driving elements 30B to 30D for adjusting positions and inclining angles of the lenses L12 to L15 in the direction Z. A lens driving mechanism including the driving elements 30B to 30D in covered with a cover 58B.

The first objective portion 41 and the optical axis turn portion 43 are coaxial with respect to each other. Let us assume the common axis to be an optical axis AX1. The optical axis AX1 is perpendicular to the pattern surface of the reticle R.

A small-sized mirror 48 is disposed in the lens barrel 47 of the optical axis deflecting portion 46 between the lens barrels 42 and 44 at a position decentered to the direction +Y from the optical axis AX1. The small-sized mirror 48 has a reflecting surface tilted clockwise at approximately 45° with respect to the optical axis AX1.

A beam splitter 50 is disposed in a direction in which light reflected from the concave mirror 45 is reflected by the small-sized mirror 48. The optical axis AX2 is perpendicular to the optical axis AX1. The beam splitter 50 has a reflecting surface tilted at approximately 45° with respect to the optical axis AX2 so that the reflecting surface of the bean splitter 50 perpendicularly intersects the reflecting surface of the small-sized mirror 48.

An optical path in the direction +Y from the small-sized mirror 48 to the beam splitter 50 is required to have high stability. Therefore, both the small-sized mirror 48 and the beam splitter 50 are supported in a common ions barrel 47, and space is formed in the lens barrel 47 between the small-sized mirror 48 and the beam splitter 50. In order to enhance the stability, the small-sized mirror 48 and the beam splitter 50 may be integrally formed as one piece like a prism. The beam splitter 50 has a transmittance of 0.1% and a high reflectivity of on the order of 99.9%.

Further, a light quantity monitor 51 comprising a photovoltaic photodetector for monitoring, through a lens L61, a light quantity of luminous flux of light passing through the concave mirror 45 and the beam splitter 50 from the reticle side, and a reflection coefficient monitor 49 comprising a photovoltaic photodetector for detecting, through a lens L60, a light quantity of luminous flux of light reflected by the wafer surface and passing through the beam splitter 50 are disposed. In this case, for detecting the quantity of light in an entire region of a rectangular illumination area 15 or an exposure region 16, the light quantity monitor 51 and the reflection coefficient monitor 49 are disposed at pupil positions or image-forming positions of the lenses L60 and L61 respectively, and detection signals of these monitors are supplied to the image correcting apparatus 31.

A lens barrel 53 of the second objective portion 52 is disposed in contact with the lens barrel 47 to extend in a direction in which the optical axis AX2 bent by the beam splitter 50 extends. In the lens barrel 53, lenses L41 to L49 are disposed in this order from the beam splitter 56 side through lens frames. The bottom surface of the lens L52 faces the surface of the wafer W.

Further, a side face of the lens barrel 53 is provided with a driving element 30E for independently or collectively adjusting positions and inclining angles of the lenses, L44 and L45 in the direction Z. The side face of the lens barrel 53 is provided with a light-shield member transfer mechanism 57 for inverting a pupil filter 60 (see FIG. 5A) into a pupil plane (optical Fourier conversion plane with respect to a pattern surface of the reticle R) of the projection optical system PL. A variable aperture stop 56 for controlling numerical aperture is provided directly below the disposed plane of the pupil filter. The lens driving mechanism including the driving element 30E and the light-shield member transfer mechanism 57 are covered with a cover 58C and sealed. In this case, since the piping 135E for discharging helium gas having lowered purity in the projection optical system PL is provided to the cover 58 in which the various driving mechanisms are accommodated, there is a merit that dust and the like generated by these driving mechanisms are also discharged together.

The optical axis, AX3 of the second objective portion 52 is parallel to the common optical axis AX1 of the first objective portion 41 and the optical axis turn portion 43 and perpendicular to the optical axis AX2 of the optical axis deflecting portion 46.

In the projection optical system FL according to the present embodiment, the rectangular illumination area 15 on the reticle R, illuminated by the illuminating light IL, is set at a position decentered to the direction −Y from the optical axis AX1. Illuminating light passing through the illumination area 15 (the light will hereinafter be referred to as "image-forming light beam") passes through the lenses L1 to L4 in the first objective portion 41 and further passes through the inside of the lens barrel 47 of the optical axis deflecting portion 46 to enter the optical axis turn portion 43. The image-forming light beam entering the optical axis turn portion 43 passes through the lenses L11 to L15 to be incident on the concave mirror 45. The image-forming light beam reflected and condensed by the concave mirror 45 passes through the lenses L15 to L11 again and is then deflected to travel in the direction +Y by the small-sized mirror 48 in the lens barrel 47 of the optical axis deflecting portion 46.

In the optical axis deflecting portion 46, the image-forming light beam reflected by the small-sized mirror 48 enters the beam splitter 50. At this time, an image (intermediate image) approximately equal in size to the pattern in the illumination area 15 on the reticle R is formed near the beam splitter 50 in the lens barrel 47. Accordingly, a composite system formed from the first objective portion 41 and the optical axis turn portion 43 is referred to as "1:1 optical system".

The image-forming light beam deflected to travel to the direction −Z by the beam splitter 50 goes toward the second objective portion 52, in which the image-forming light beam passes through the lenses L41 to L49 to form in the exposure area 16 on the wafer W a demagnified image of the pattern in the illumination area 15 on the reticle R. Accordingly, the second objective portion 52 will be hereinafter occasionally referred to as "reduction projection system".

As stated above, the image-forming light beam passing through the illumination area 15 on the reticle R approximately to the direction −Z is turned back approximately to the direction +Z through the first objective portion 41 and the optical axis turn portion 43 in the projection optical system PL according to this embodiment. The image-forming light beam is then successively turned approximately to the directions +Y and −Z by the optical axis deflecting portion 46. During the course of being turned, the image-forming light beam forms an intermediate image approximately equal in size to the pattern in the illumination area 15, and thereafter, forms a demagnified image of the illumination area 15 in the exposure area 16 on the wafer W through the second objective portion 52.

By virtue of this arrangement, the projection optical system PL can use axially symmetric lenses for all the lenses. Only by forming almost all the lenses from quartz, forming only three or four of the lenses from fluorite and forming several lenses among these lenses into aspheric ones, it is possible to design a catadioptric projection optical system in which an effective field is amount 27.5 mm×8 mm and the numerical aperture is about 0.7 and which comprises 15 to 25 lenses each having a maximum lens diameter of 300 mm or less.

In the present embodiment, the air-tightness of the projection optical system PL is enhanced by covering the lens driving mechanism including the driving elements 30A to 30E and the light-shield member transfer mechanism 57 with the covers 58A to 58C, thereby preventing helium gas supplied from the piping 135A from flowing outside. Further, heat generated by the exposure is collected and a temperature in the projection optical system PL is adjusted by adjusting a temperature of the helium gas to be supplied to the projection optical system PL and by utilizing the helium gas as the heat exchange medium.

Of the lenses constituting the projection optical system PL of the present embodiment, the lenses L11, L41 and 47 are aspherical lenses and space near these lenses is wide. The fluorite bas a larger thermal expansion amount and the image-forming characteristics of the fluorite is largely varied with slight variation in temperature as compared with quartz. Therefore, lenses which are in direct contact with outside air of the projection optical system PL and lenses in the vicinity of the former lenses, i.e., lenses disposed near the reticle R or the wafer W (such as the lenses L1, L49) are made of quartz. Thus, it is preferable that a lens made of fluorite is disposed at a position where a temperature thereof can sufficiently be adjusted by the helium gas, and that the lens is disposed at inner side separated from the both end lenses L1 and L49 by at least one or more lenses.

Figure 4A:
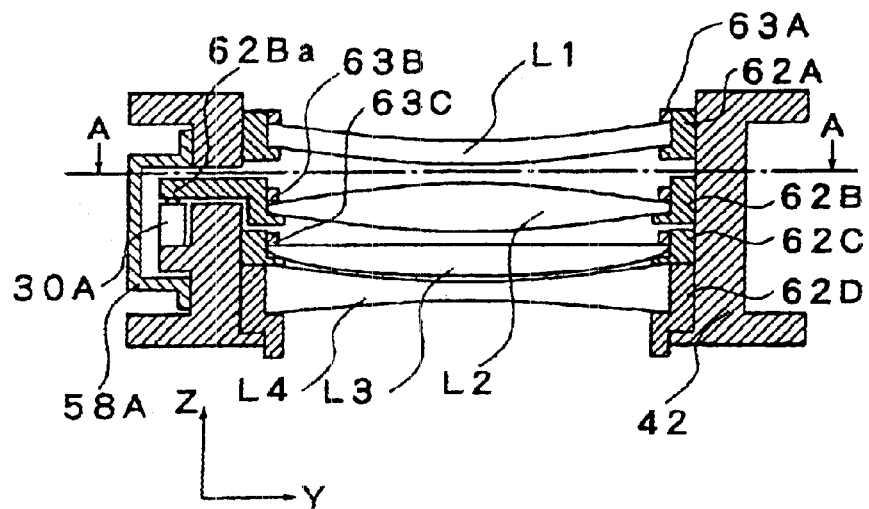
FIGS. 4A and 4B are respectively enlarged longitudinal and transversal sectional views of a first objective portion 41 of the projection optical system PL shown in FIG. 2.

Next, a driving operation of the lenses of the projection optical system PL of the exposure apparatus of the present embodiment will be explained with reference to FIG. 4A and 4B. FIG. 4A is a sectional view of the lens barrel 42 of the projection optical system PL shown in FIG. 2. In FIG. 4A, the lens barrel 42 is a split-type lens barrel. The lenses L1 to L4 are respectively supported by lens frames 62A to 62D from above of the lens barrel. The lenses L1 to L3 are respectively held by fixing rings 63 to 63C from above. The lens frame 62B for supporting the lens L2 is provided at its three portions with projections 72Ba (See FIG. 4B). These three projections 62Ba pass through openings of the lens barrel 42 and project outside, and the three projections 62Ba are vertically driven by driving elements 30A provided on an outer face of the lane barrel 42. Driving mechanisms for the lens L2 comprising three projections 62Ba and the driving elements 30A are respectively covered with covers 58A to prevent helium from flowing outside of the projection optical system PL. These covers 58A can be detached from the lens barrel 42 when the driving elements 30A are replaced.

Figure 4B:
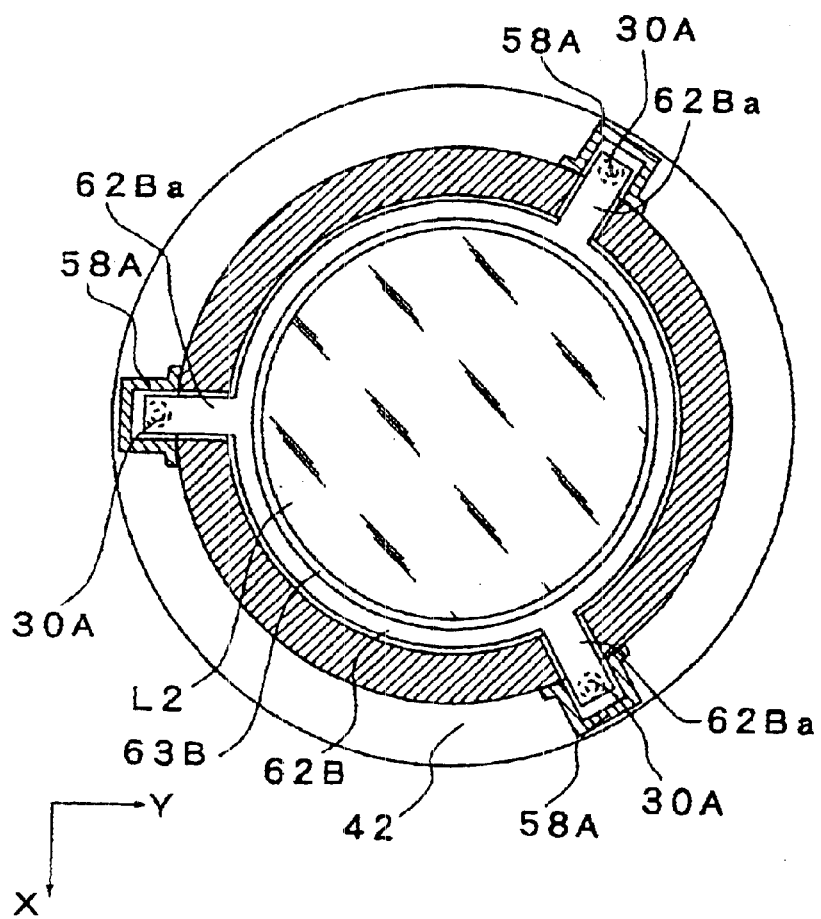

FIG. 4B is a sectional view taken along a line A—A in FIG. 4A. In FIG. 4B, a position of the lens L2 in the optical axis direction (direction Z) is controlled by adjusting the driving amounts of the three driving elements 30A to the same value. By independently controlling the driving amounts of the three driving elements 30A, the inclining angle of the lens L2 can be controlled. The control amounts of the position in the optical axis direction and the inclining angle of the lens L2 are determined in the following manner. First, an illumination amount of the illuminating light IL to the projection optical system PL is calculated based on the detection signals of the reflection coefficient monitor 49 and the light quantity monitor 51 supplied to the image correcting apparatus 31 shown in FIG. 2. An error of each of the image-forming characteristics is calculated based on the relation between the illumination amount and the image-forming characteristics (such as projection magnification, distortion, focus position, image curve, image inclination, astigmatic aberration, coma aberration and the like). The relation between the illumination amount and the image-forming characteristics has been previously measured, and stored in a memory section of the main controller 7 as a mathematical expression. Similarly, pressure of the outside air of the projection optical system PL is also measured, and an error of the image-forming characteristics in accordance with a variation amount of the this pressure is also calculated.

The relation between the image-forming characteristics and the driving amount (position and inclining angle of the lens L2 in the optical axis direction) of the driving element 30A in accordance with the pressure and the illumination amount to the projection optical system PL has been previously simulated, a result of the simulation has been corrected based on a result obtained by actually driving the lenses, and the corrected data has been stored in the main controller 7 as mathematical expressions. By driving the driving elements 30A by the calculated driving amount based on these related mathematical expressions, the errors of the predetermined image-forming characteristics are corrected. Since the helium gas having a small variation amount of the index of refraction is circulated in the projection optical system PL, a variation in the pressure in the projection optical system PL does not affect the image-forming characteristics almost at all. However, since nitrogen gas or dry air is circulated outside the lenses L1 and L49 at the both ends of the projection optical system PL, a relation between a variation amount of the image-forming characteristics in accordance with the pressure of the outside air of the projection optical system PL and a driving amount of the driving elements 30A for correcting this variation amount is stared.

Although the lens driving mechanism in the cover 58A was explained here as one example, a plurality of and one lens driving mechanisms are respectively provided also in the covers 58B and 58C.

Figure 5A:
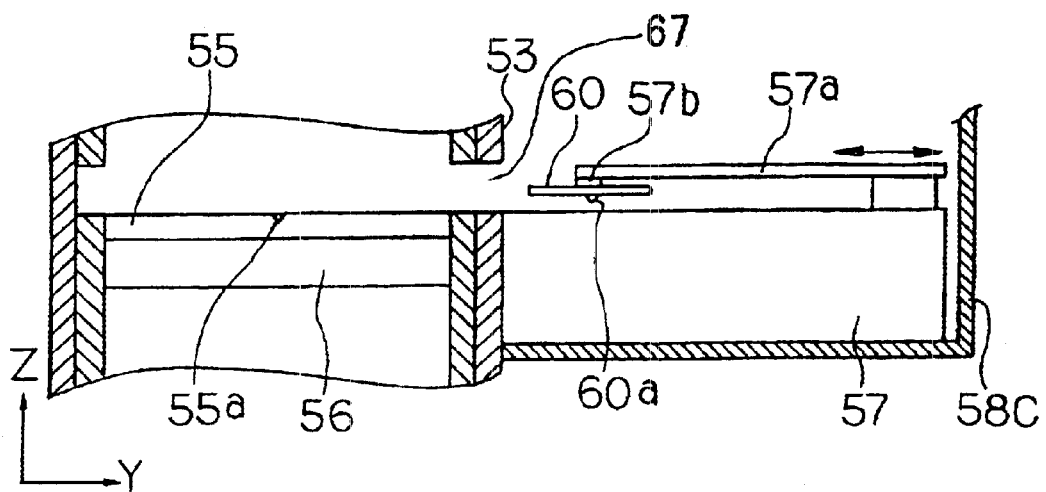
FIGS. 5A to 5C are enlarged views of a portion of the projection optical system PL in the vicinity of a pupil portion.
Figure 5B:
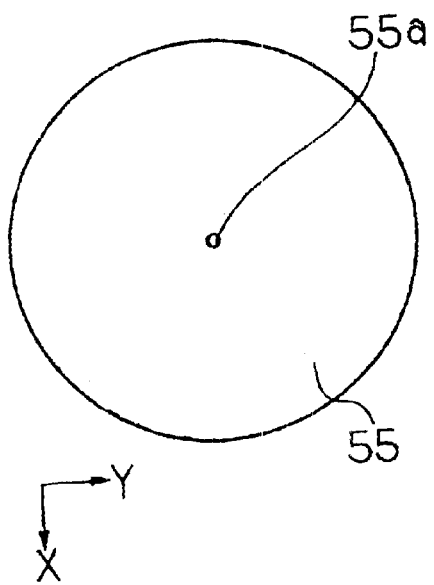
Figure 5C:
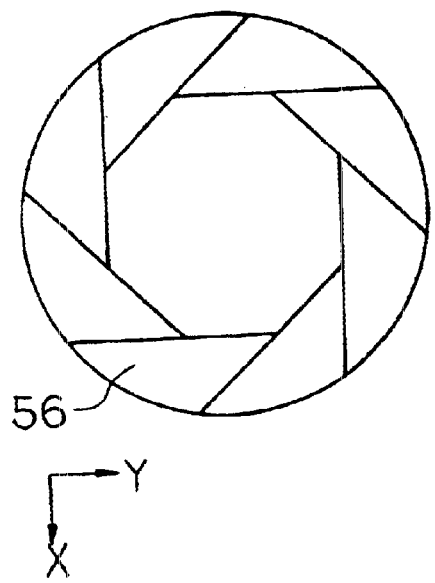

Next, the pupil filter of the projection optical system PL and the variable aperture stop 56 of the present embodiment will be explained with reference to FIGS. 5A to 5C and 6A to 6C. FIG. 5A is an enlarged view of the projection optical system PL in the vicinity of the pupil plane. In FIG. 5A, a glass plate 55 is disposed on a pupil plans in lens barrel. 53, and the variable aperture stop 56 is disposed on a position slightly deviated from a pupil plane directly below the glass plate 55. A shield member transfer mechanism 57 for attaching and detaching the pupil filter 60 to the vicinity of the pupil plane of the projection optical system PL is provided in a cover 58c attached on aside face of the lens barrel 53. An electromagnet 57b is fired on a tip and of a holding bar 57a which is driven in a radial direction of the lens barrel 53 by this shield member transfer mechanism 57. When the pupil filter 60 is mounted, the light shield circular pupil filter 60 made of a magnetic substance is held by the electromagnet 57b, and the pupil filter 60 is inserted into the lens barrel 53 from an opening 67 through a holding bar 57a and is placed on the glass plate 55. As shown in FIG. 5B, an upper surface of the glass plate 55 is provided at its center (on the optical axis) with a recess 55a. The positioning of the pupil filter 60 is carried out by fitting a projection boa provided on a center of a bottom surface of the pupil filter 60 into this recess 55a. A size of the recess 55a of the glass plate 55 is 0.1% or less of the entire opening of the pupil plane, and the recess 55a does not affect the image-forming characteristics of the projection optical system PL almost at all. As shown in FIG. 5C, the variable aperture stop 56 located below the glass plate 55 is an iris stop comprising several blades. The main controller 7 shown in FIG. 1 set a size of as opening of the variable aperture stop 56 through the image correcting apparatus 31.

Figure 6A:
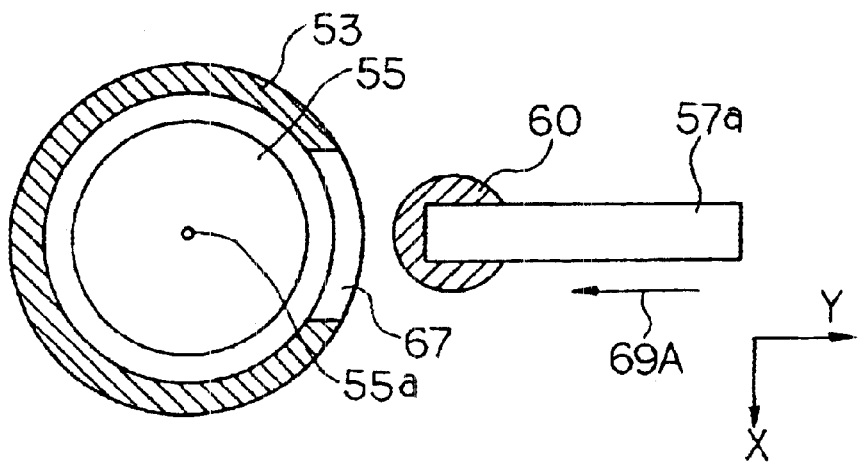
FIGS. 6A to 6C are views showing as operation for disposing a pupil filter 60 on a pupil plane of the projection optical system PL.
Figure 6B:
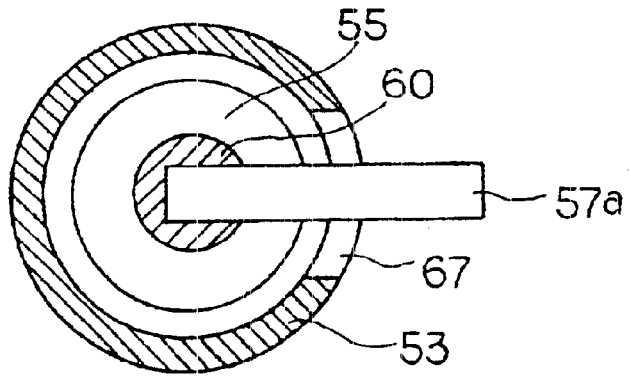
Figure 6C:
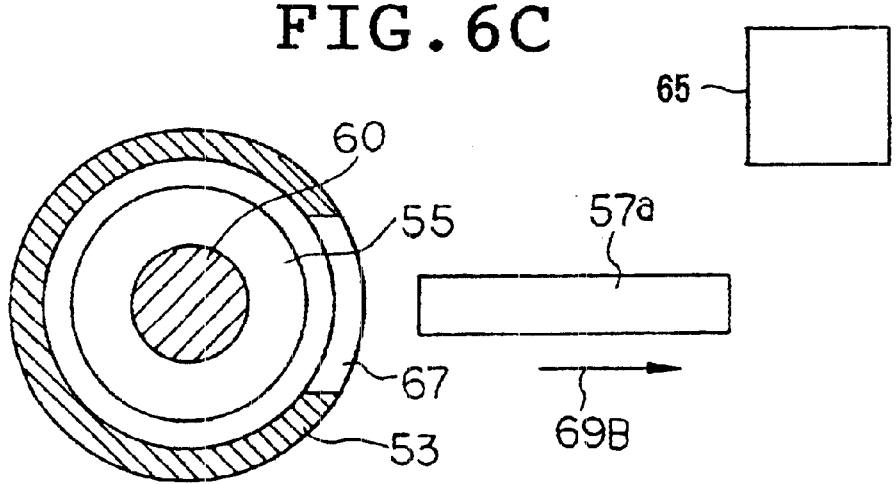

FIGS. 6A to 6C show an operation for mounting the pupil filter 60 to the pupil plane of the projection optical system PL. First, in FIG. 6A, the holding bar 57a of the shield member transfer mechanism 57 holds the pupil filter 60 and moves the same in a direction of an arrow 69A. As shown in FIG. 6B, the center of the pupil filter 36 moves to a center position of the pupil through an opening 67. Then, absorption of the electromagnet 57b (See FIG. 5A) on the tip end of the holding bar 57a is turned off, and the eye filter 60 is placed on the glass plate 55. Then, the holding bar 57a is retreated in a direction of an arrow 69B shown in FIG. 6C. The pupil filter 60 is coaxially placed on the glass plate 55 in the above-explained manner. When the pupil filter 60 is taken out, the above procedure is reversed. The shield member transfer mechanism 57 can drive the holding par 57a not only in the direction Y, but also in the direction X, and a rotation mechanism is also incorporated in the holding bar 57a. Any of a plurality of eye filters accommodated in an accommodating case 65 can be taken out and detached through the holding bar 57a. In the present embodiment, as described above, space required for disposing the pupil filter 60 and the variable aperture stop 56 can be reduced by offsetting the pupil filter 60 and the variable aperture stop 56 in the optical axis direction of the projection optical system PL in the vicinity of the pupil plane of the projection optical system PL. Therefore, a portion for purging the helium gas can be minimised.

Next, another example of arrangement of the pupil filter and the variable aperture stop 56 will be explained with reference to FIGS. 7A to 7D. When a width of a region which can be substantially considered as a pupil plane is small and it is not preferable to offset the pupil filter and the variable aperture stop 56 in the optical axis direction, the pupil filter and a member ("NA variable member" hereinafter) which can be used as a substitute of the variable aperture stop 56 are disposed on the same plane (pupil plane).

Figure 7A:
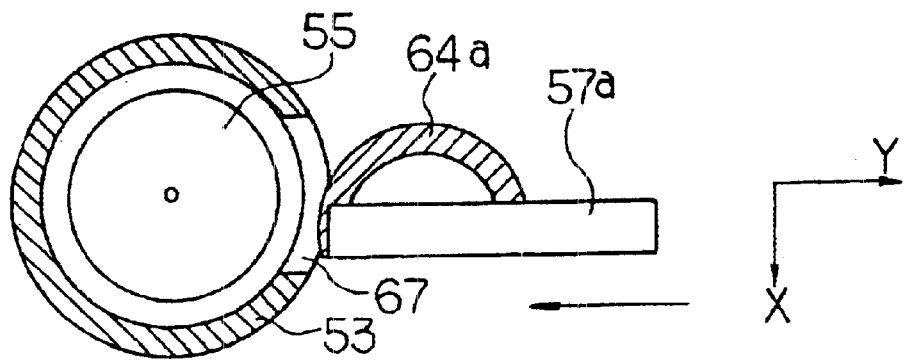
FIGS. 7A to 7D are views showing an operation for disposing a annular-zone-shaped filter 64 on the pupil plane of the projection optical system PL.
Figure 7B:
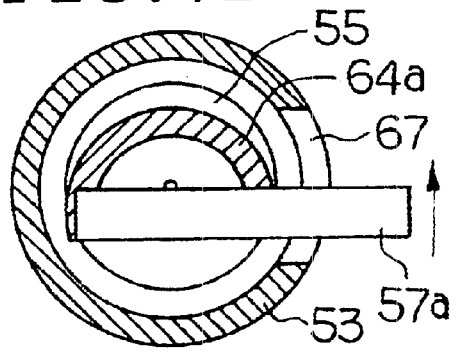
Figure 7C:
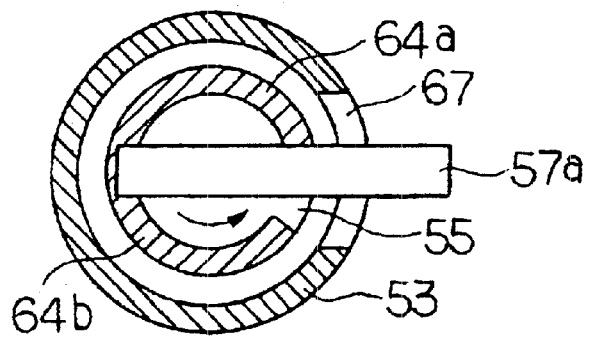
Figure 7D:
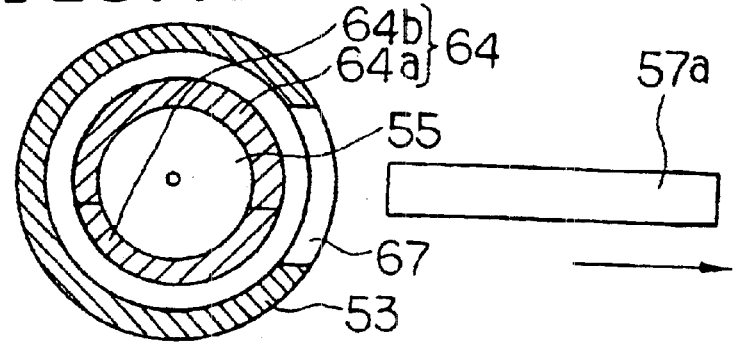

FIGS. 7A to 7D show an operation for disposing a annular-zone-shaped filter as the NA variable member on the glass plate 55 of the pupil plane of the projection optical system PL. As shown in FIGS. 7C and 7D, the annular-zone-shaped filter 64 comprises two arc light shield members 64a and 64b superposed one above the other along an arc guide (not shown), and the arc light shield members 64a and 64b are expanded to from an annular zone by an arc air cylinder. When the annular-zone-shaped filter 64 is disposed, in FIG. 7A, the light shield member 64a in which the light shield member 64b is accommodated is first held on a bottom surface of the holding bar 57a. A position of the holding bar 57a is shifted to the direction +X and in this state, the holding bar 57a is moved to the direction −Y, and the light shield member 64a is inserted into the lens barrel 53 from the opening 67 of the lens barrel 53. Next, as shown in FIG. 7B, the holding bar 57a is moved to the direction −X to align the light shield member 64a and the glass plate 55 with each other. Then, as shown in FIG. 7C, gas is supplied into an air cylinder in the light shield member 64a to push out the arc light shield member 64b. Thereafter, as shown in FIG. 7D, the light shield member 64b is completely expanded to complete the annular-zone-shaped filter 64 and then, the absorption of the electromagnet 57b (See FIG. 5A) on the tip end of the holding bar 57a is turned off. Then, the annular-zone-shaped filter 64 is placed on the glass plate 55, and the holding bar 57a is retreated to the direction +Y. The annular-zone-shaped filter 64 is disposed on the pupil plane of the projection optical system PL in this manner, and the pupil filter 60 is disposed in the annular-zone-shaped filter 64 as shown in FIGS. 6A to 6C. Thus, the pupil filter 60 and the annular-zone-shaped filter 64 as the NA variable member can be disposed on the same plane (pupil plane). When the annular-zone-shaped filter 64 is taken out from the lens barrel 53, the above mounting procedure is reversed. Like the pupil filter 60, a plurality of annular-zone-shaped filters having different inner diameters are accommodated in the accommodating case 65 shown in FIG. 6C. By selecting one of annular-zone-shaped filter having an inner diameter corresponding to a required numerical aperture and replacing with it, the desired numerical aperture can be obtained.

Next, an assembling method of the projection optical system PL of the projection exposure apparatus of the present embodiment will be explained.

The projection optical system PL shown in FIG. 2 is optically divided into three parts, i.e. the 1:1 optical system including the first objective portion 41 and the optical axis turn portion 43, the optical axis deflecting portion 46, and the, reduction projection system of the second objective portion 52. From the viewpoint of a mechanical structure, the small-sized mirror 48 is interposed between the lens L4 of the first objective portion 41 and the long L11 of the optical axis turn portion 43. Therefore, if the lens L4, the small-sized mirror 48 and the fens L11 are incorporated into the same lens barrel, the small-sized mirror 48 and the bean splitter 50 in the optical axis deflecting portion 46 will be necessary to incorporate into separate lens barrels from the viewpoint of adjustment. However, if the small-sized mirror 48 and the beam splitter 50 are incorporated into separate lens barrels, it is likely that perpendicularity between the reflecting surfaces of the two members will vary. A variation in the perpendicularity between the two reflecting surfaces causes the image-forming characteristics to be degraded. In this embodiment, therefore, the 1:1 optical system is divided into the first objective portion 41 and the optical axis turn portion 43 through the lens barrel 47 of the optical axis deflecting portion 46, and the small-sized mirror 48 and the beam splitter 50 are secured in the lens barrel 47.

To assemble the projection optical system PL, the first objective portion 41, the optical axis turn portion 43, the optical axis deflecting portion 46, and the second objective portion 52 are assembled and adjusted separately in advance. Thereafter, the lower part of the lens barrel 44 of the optical axis turn portion 43 and the lower part of the lens barrel 53 of the second objective portion 52 are inserted into respective through-holes provided in an intermediate plate 25c of the column 25 (see FIG. 9). Then, washers are put between a flange 44a of the lens barrel 44 and the intermediate plate 25c of the column 25 and between a flange 53a of the lens barrel 53 and the intermediate plate 25c of the column. 25, and the flanges 44a and 53a are temporarily screwed to the intermediate plate 25c. Then, the lens barrel 47 of the optical axis deflecting portion 46 is placed on the upper ends of the lens barrels 44 and 53. A washer is put between a flange 47a of the lens barrel 47 and a flange 53b at the upper end of the lens barrel 53, and the flange 47a is temporarily screwed to the flange 53b.

Then, a laser beam for adjustment is applied to the inside of the lens barrel 44 from above the lens L11 in the lens barrel 44 to monitor a position passed by the laser beam emitting from the lowermost lens L49 in the leas barrel 53 (i.e. a position on a plane corresponding to the surface of the wafer W), and the thicknesses of the washers under the bottoms of the flanges 44a, 47a, 53a and 53b are adjusted and the lens barrels 42, 53 and 47 are transversely moved so that the monitored position coincides with the target position. In a state where the position of the laser beam reaches the target position, the flanges 44a, 47a, 53a and 53b are properly screwed, thereby securing the optical axis turn portion 43, the second objective portion 52, and the optical axis deflecting portion 46.

Finally, the lens barrel 42 of the first objective portion 41 is moved to a position above the end of the lens barrel 47 which faces in the direction −Y. A washer is put between a flange 42a of the lens barrel 42 and the flange 47b of the lens barrel 47, and the lens barrel 42 is placed on the lens barrel 47. Then, a laser beam for adjustment is again irradiated from above the lens L1 in the lens barrel 42, for example, to thereby perform optical axis adjustment. Thereafter, the lens barrel 42 is screwed onto the lens barrel 47, thereby respectively sealing between the flange 42a and flange 47b, between the flange 47c and the flange 44b, and between the flange 47a and the flange 53b. Thus, the incorporation of the projection optical system PL into the projection exposure apparatus is completed.

Further, in this embodiment, the center 54 of gravity of the whole projection optical system PL is set at a position in the projection optical system PL and outside the optical path of the image-forming light beam by taking into consideration the stability of image-forming characteristics with respect to vibrations and the balance of the projection optical system PL. That is, in FIG. 2, the center 54 of gravity of the projection optical system PL is set at a position near the middle between the optical axis turn portion 43 and the second objective portion 52 and at the almost same position as the flange 44a of the barrel 44 and the flange 53a of the lens barrel 53. Thus, by setting the center 54 of gravity of the projection optical system PL closer to the flanges 44a and 53a, the projection optical system PL has a structure that is not readily affected by vibrations and exhibits high rigidity.

Next, another example of the assembling method of the projection optical system PL will be explained with reference to FIG. 10. Since the projection optical system PL comprises four lens barrels, the optical adjustment in extremely difficult. After the optical adjustment is completed using an assembling tool and an adjusting tool such as a wave front checking apparatus, and when the projection optical system PL is mounted on the intermediate plate 25c of the column 25 on the projection exposure apparatus, if positioning operation of the four lens barrels is carried out again, it takes a long time for the adjustment procedure. Therefore, the following contrivance is preferable.

Figure 10:
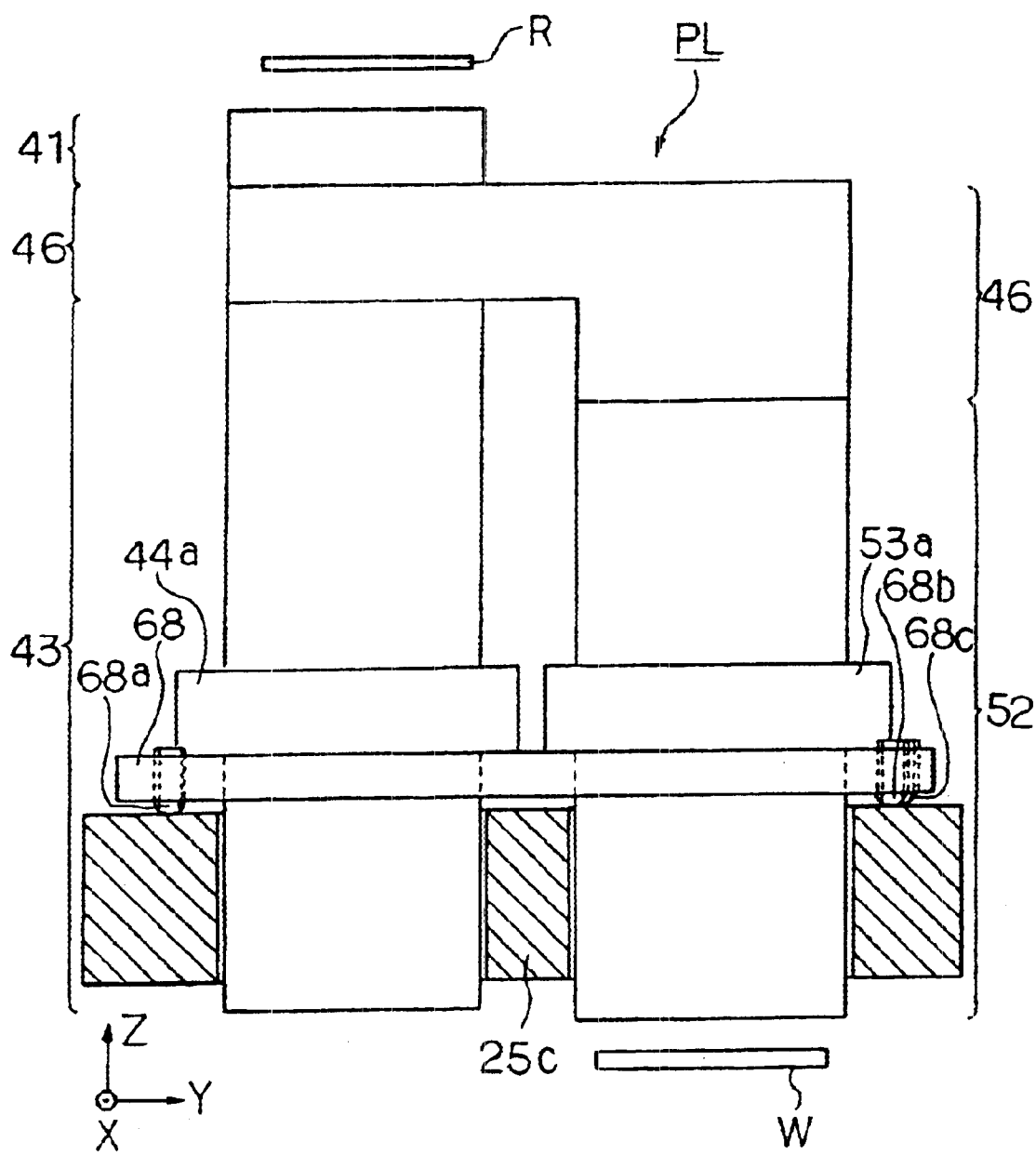
FIG. 10 is a partially broken away view showing the projection optical system PL supported on a support member 68.

FIG. 10 shows the projection optical system PL supported on the flat-plate like support member 68 made of alloy (e.g., invar) having a low thermal expansion coefficient. In FIG. 10, an optical axis turn portion 43 and a second objective portion 52 are incorporated in two openings of the support member 68. Further, the support member 68 is provided with adjusting screws 68a to 68c for supporting the support member 68 at three points. A position in the direction Z and an inclining angle of the support member 68 can be adjusted by adjusting heights of the adjusting screws 68a to 68c. When the optical adjustment of the projection optical system PL is carried out, the projection optical system PL is placed on the adjusting tool together with the support member 68. At that time, the inclination of a plane determined by three points of the adjusting screws 68a to 68c with respect to a horizontal plane, and an error thereof is corrected. After the optical adjustment of the projection optical system PL, the projection optical system PL and the support member 68 are detached from the adjusting tool as one piece, and both of them are placed on the intermediate plate 25c of the column 25 of the projection exposure apparatus. At that time, the heights of the adjusting screws 68a to 68c are adjusted such that the inclination of the projection optical system PL becomes equal to an inclination thereof on the adjusting tool. With this adjustment, it is possible to eliminate optical deviation caused by moving the projection optical system PL onto the projection exposure apparatus from the adjusting tool. Therefore, since the optical adjustment is almost unnecessary on the projection exposure apparatus, it is possible to shorten the assembling time of the projection optical system PL.

Next, an air conditioning system of the projection exposure apparatus according to the present embodiment will be described with reference to FIG. 3. The projection exposure apparatus according to this embodiment is installed in a given chamber as a whole. The projection exposure apparatus is divided into a plurality of units, and air conditioning is independently carried out for each unit. Such an air conditioning system will hereinafter be referred to as "unit-by-unit air conditioning system".

Figure 3:
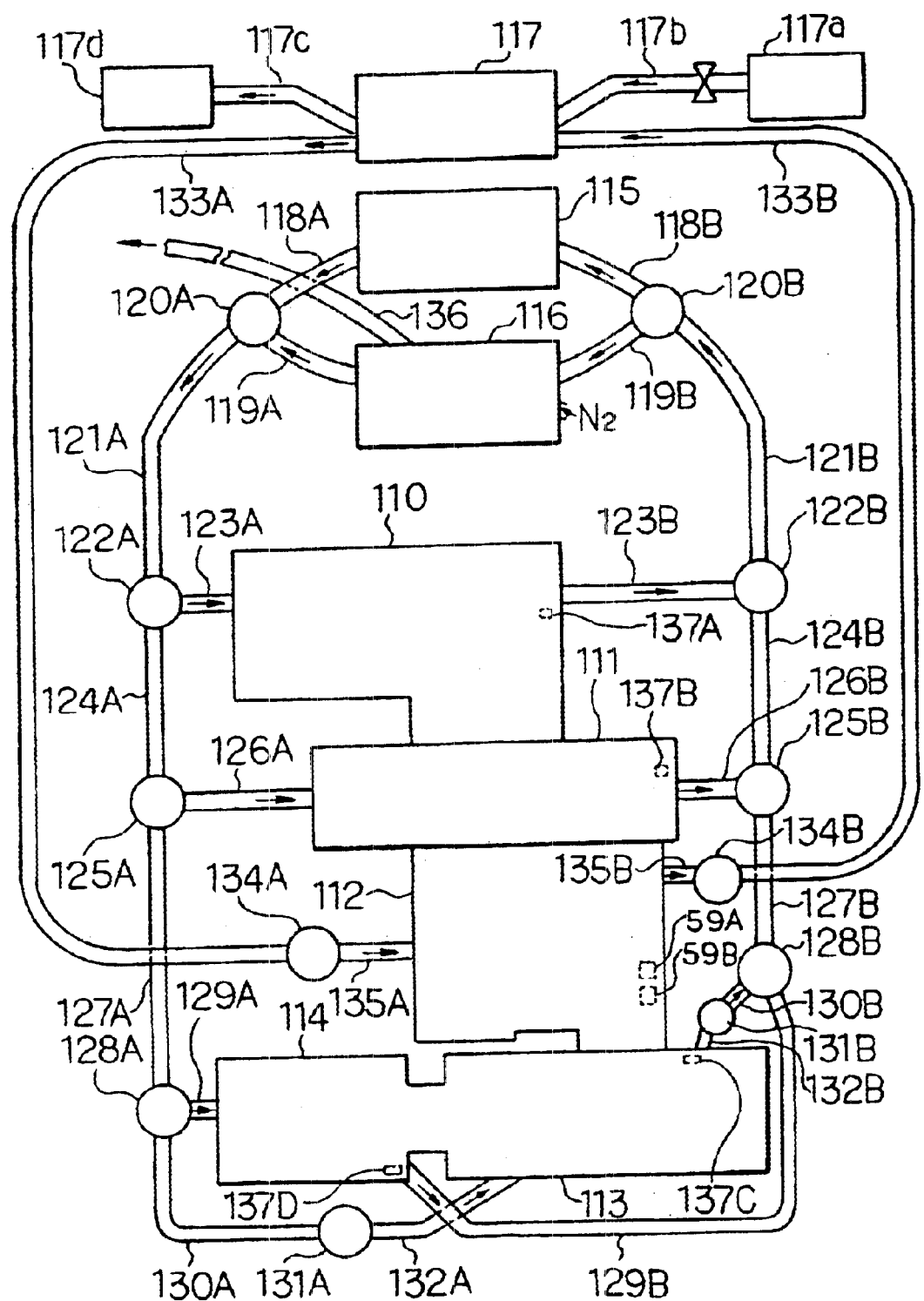
FIG. 3 is a block diagram showing a unit-by-unit air conditioning system of the projection exposure apparatus used in the embodiment of the present invention.

FIG. 3 shown a unit-by-unit air conditioning system according to this embodiment. In FIG. 3, the projection exposure apparatus shown in FIG. 1 is roughly divided into an illumination system unit 110, a reticle stage system unit 111, a projection optical system unit 112, a wafer stage system unit 113, and a wafer transfer system unit 114. More. specifically, the illumination system unit 110 has a box-shaped casing accommodating the illumination optical system, shown in FIG. 1, which includes the excimer laser light source 2, the deflection mirror 3, the first illumination system 4, the switching revolver 5, the beam splitter 8, the integrator sensor 9, the second illumination system 10, the illumination field stop system 11, and the third illumination system 14. The reticle stags system unit 111 has a box-shaped casing accommodating the reticle support 18, the reticle stage 17 (including the moving mirror 19m), the reticle R, the optical path between the reticle R and the third illumination system 14, and the optical path between the reticle R and the projection optical system PL, which are shown in FIG. 1.

The projection optical system unit 112 is the projection optical system PL itself, which is shown in FIG. 2. An integral structure comprising the lens barrels 42, 44, 47 and 53 of the projection optical system PL is regarded as a casing, and the projection optical system unit 113 is arranged to be capable of controlling the flow of a gas between the lens units in this casing. The wafer stage system unit 113 has a box-shaped casing installed on the surface plate 23, shown in FIG. 1, to accommodate the wafer stage 22, the sample table 21 (including the moving mirror 24*m* and the fiducial mark member FM), the wafer holder 20, the wafer W, and the space portion between the projection optical system PL and the wafer W. The wafer transfer system unit 114 has a box-shaped casing accommodating the wafer transfer system, which is not shown in FIG. 1.

In this embodiment, supplying and discharging a predetermined gas is allowed to be performed for each of the illumination system unit 110, the reticle stage system unit 111, the projection optical system unit 112, the wafer stage system unit 113, and the wafer transfer system unit 114 independently of each other.

Especially, it is necessary to supply gas such as nitrogen gas, helium gas or air from which ozone is removed to the unit having the optical path of the illuminating light for exposure such as the illumination system unit 110 and the projection optical system unit 112 for suppressing an absorption amount of the ArF excimer laser light by ozone, oxygen or the like. In the present embodiment, helium gas having small index of refraction is supplied to the projection optical system unit 112 for preventing the ArF excimer laser light from being absorbed by ozone or the like, and for suppressing wandering of the projection image due to variation in temperature.

The air conditioning system is provided with a first air conditioner 115 incorporating an HEPA filter (High Efficiency Particulate Air-Filter) as an ozone-removing filter and a dust-removing filer, a second air conditioner 116 for circulating nitrogen ($N_2$) supplied from a nitrogen gas cylinder (not shown), and a third air conditioner for supplying helium gas to the projection optical system unit 112. The first air conditioner 115 removes, through the dust-removing filter, dust from air taken in from the outside of the chamber and air returned through a piping 118B, adjusts the temperature and flow rate of air having ozone removed therefrom through the ozone-removing filter, and supplies the air, which has been subjected to the temperature and flow rate adjustment, to a gas changeover device 120A through a piping 118A. The second air conditioner 216 adjusts the temperature and flow rate of a high-purity portion of nitrogen gas returned through piping 119B, and circulates the high-purity portion of nitrogen gas through piping 119A. Moreover, the second air conditioner 116 releases the low-purity portion of nitrogen gas through a piping 136 into a collecting apparatus (not shown) outside a clean room in which the chamber is installed. Further, the second air conditioner 116 supplements a deficiency of nitrogen gas with nitrogen gas from the nitrogen gas cylinder, that is, thereby carrying out purging with high purity nitrogen gas.

Like the first air conditioner 115, the second air conditioner 116 includes an ozone-removing filter and an HEPA filter. Each of the first and second air conditioners 115 and 116 also includes a chemical filter for removing ion, silicon-based organic compound, water and the like.

The gas changeover device 120A supplies one of two different kinds of chemically clean gas (i.e. ozone-free air prepared by the removal of ozone, and nitrogen gas) to a gas volume controller 122A through a piping 121A. The gas volume controller 122A supplies the gas to the inside of the illumination system unit 110 through a piping 123A and also supplies the gas to a gas volume controller 125A through a piping 124A. The gas volume controllers 122A and 125A (the same is the case with other gas volume controllers) each have the function of supplying the gas supplied thereto after controlling the temperature and flow rate thereof. The gas volume controller 125A supplies the gas to the inside of the reticle stage system unit 111 and a gas volume controller 128A through respective pipings 126A and 127A. The gas volume controller 128A supplies the gas to the inside of the wafer transfer system unit 114 through a piping 229A and also supplies the gas to the inside of the wafer stage system unit 113 through a piping 130A, a gas volume controller 231A and a piping 132A.

The gas circulating through the wafer transfer system unit 114 is discharged to a gas volume controller 128B through a piping 129B. The gas circulating through the wafer stage system unit 113 is discharged to the gas volume controller 128B through a piping 132B, a gas volume controller 131B and a piping 130B. The gas from the gas volume controller 128B and the gas circulating through the inside of the reticle stage system unit 111 are discharged to a gas volume controller 125B through respective pipings 127B and 126B.

Similarly, the gas discharged from the gas volume controller 125B and the gas circulating through the illumination system unit 110 are discharged to a gas volume controller 122B through respective pipings 124B and 123B. The gas discharged from the gas volume controller 122B is supplied to a gas changeover device 120B through a piping 121B. When the supplied gas is air, the gas changeover device 120B returns it to the first air conditioner 115 through the piping 118B, whereas, when the supplied gas is nitrogen gas, the gas changeover device 120B returns it to the second air conditioner 116 through the piping 119B. Accordingly, either the ozone-free air or nitrogen gas is selectively supplied in common to the illumination system unit 110, the reticle stage system unit 111, the wafer stage system unit 113, and the wafer transfer system unit 114.

The third air conditioner 117 supplies helium gas, whose temperature and flow rate have been adjusted, to the projection optical system unit 112 through the piping 133A, a gas volume controller 134A and a piping 135A. The helium gas circulating through the projection optical system unit 112 is returned to the third air conditioner 117 through a piping 135B, a gas volume controller, 134B and the piping 133B.

Further, the third air conditioner 117 adjusts a temperature and a flow rate of helium gas portion having high purity among helium gas, which is returned through the piping 133B, and again circulates the helium gas through the piping 113A. The third air conditioner 117 also discharges helium gas portion having low purity into a helium collecting apparatus 117*d* through the piping 117*c*. The third air conditioner 117 compensates insufficient helium gas from a helium gas cylinder 117*a* (or cylinder for liquefying and accumulating helium) through the piping 117*b* so that the helium gas can always be purged with high purity. The third air conditioner 117 also includes an ozone-removing filter, an HEPA filter and a chemical filter.

Purity sensors 137A to 137D are disposed in the vicinity of discharge ports in the illumination system unit 110, the light source stage system unit 111, the wafer stage system unit 113 and the wafer transfer system unit 114. A purity sensor 59A and a temperature sensor 59B for helium gas are disposed in the projection optical system unit 112 (see FIG. 2). Based on the detection results of these sensors 59A, 59B, 137A to 137D, each of the air conditioners 115 to 117 is controlled. For example, oxygen densitometers are used as the purity sensors 59A, 59B, 137A to 137D.

Since the projection optical system of the present embodiment is the catadioptric system whose space between the lenses is wide, the projection image is prone to be affected by wandering. In order to suppress the affect, only helium gas is supplied to the projection optical system unit 112 unlike other units. Therefore, the projection optical system unit 112 has high air-tightness against outside, but if gas from outside flows in from a clearance between the lens and the lens frame, the concentration of the helium gas in the projection optical system unit 112 is lowered, and the projection image is susceptible to the wandering. To avoid such a situation, it may be possible to keep supplying helium gas so that pressure of the helium gas becomes positive pressure with respect to pressure outside the projection optical system, thereby constantly keeping the purity of the helium gas in the projection optical system. However, since the helium gas is expensive, and if the flow rate of the helium gas is increased, working cost is increased. Further, if the helium gas flows out from the projection optical system unit 112, the helium gas enters to the optical path of measuring beam of the laser interferometer, which may become a cause of wandering of a measured value of the laser interferometer.

Thereupon, in the present embodiment, the pressure in the projection optical system unit 112 and the outside pressure are set substantially equal to each other, thereby preventing the helium gas from flowing outside of the projection optical system unit 112 and preventing gas outside the projection optical system unit 112 from flowing inside. Further, when detection results of the purity sensor 59A and the temperature sensor 59B for the helium gas go out of respectively predetermined tolerance ranges, a predetermined amount of helium gas is supplemented to the projection optical system unit 112 from the third air conditioner 117. At that time, if a supplement command was output because the purity of the helium gas in the projection optical system unit 112 became lower than the tolerance range, gas having low purity is discharged from the projection optical system unit 112, and an insufficient amount of helium gas is added from the helium gas cylinder 117a. If the supplement command was output because of temperature variation, a temperature of the discharged helium gas is adjusted and the helium gas is again utilized. In this manner, an amount of helium gas to be used can be minimized. Helium gas is light in weight and is prone to move upward. Therefore, in order to precisely measure the purity or the like of the helium gas in the projection optical system PL, in FIG. 2, it is preferable that the purity sensor 59A and the temperature sensor 59B are disposed below the projection optical system PL, e.g., in the vicinity of the concave mirror 45.

In this embodiment, the ArF excimer laser source is used as an exposure light source. Regarding the absorptances of gases with respect to ArF excimer laser light, for example, ozone ($O_3$) shows the highest absorptance among the ordinary air components, and oxygen ($O_2$) when it changes into ozone shows the next highest absorptance. Therefore, in order to perform exposure for the wafer W most efficiently (with the highest transmittance), it is desirable to circulate a gas such as nitrogen gas having low absorptance with respect to ArF excimer laser light through the optical path of the illuminating light IL.

Therefore, when an ordinary exposure sequence is to be carried out, the gas changeover device 120A in FIG. 3 supplies nitrogen gas from the second air conditioner 116 to the piping 121A, thereby supplying nitrogen gas to all units other than the projection optical system unit 112. Thus, transfer exposure is carried out for the wafer at a high illumination efficiency.

During maintenance or experimental exposure, the casings of units other than the projection optical system unit 112 may be opened by workmen, and therefore, nitrogen gas cannot be supplied to the units other than the projection optical system unit 112 from a safety standpoint. For this reasons, during maintenance of the like and other than exposure, the gas changeover device 120A supplies the ozone-free air from the first air conditioner 115 to the piping 121A, thereby supplying the ozone-free air to all units other than the projection optical system unit 112 to secure safety during operation while preventing the illumination efficiency from lowing.

The absorptance of the ArF excimer laser light is varied depending upon the kind of gas on the optical path of the illuminating light IL. Therefore, illuminance on a surface of the wafer W when each gas is circulated has been previously measured and stored in the main controller 7. Based on the result of this measurement, the main controller 7 controls the light emitting state of the excimer laser light source 2.

When a gas to be supplied to each unit has been switched to ozone-free air to perform maintenance or the like, to secure safety during operation, the main controller 7 stops indicating permission to start an operation or locks the cover and the like of the projection exposure apparatus in a closed state until the nitrogen concentration (or oxygen concentration) detected by the purity sensors 137A to 137D for nitrogen gas reaches the level of nitrogen concentration (or oxygen concentration) in ordinary air.

The time which elapsed before gas in each unit is substantially completely exchanged may be previously measured, and a sign showing that the operation can be started may be output when a predetermined time is elapsed after supply of air from which ozone was removed was started.

The arrangement may be such that when the photoresist coated on the wafer W requires a relatively small amount of exposure (i.e. the sensitivity of the photoresist is high), ozone-free air is supplied to each of the units 110, 111, 113 and 114 except for the projection optical system unit 112, because a reduction in the light quantity due to absorption has substantially no effect on the throughput, whereas, when the photoresist requires a relatively large amount of exposure (i.e. the sensitivity of the photoresist is low), nitrogen gas is circulated, to suppress deduction in light quantity due to absorption of illuminating light IL with a view to increasing the throughput. The number of changeovers between nitrogen gas and ozone-free air and the number of exchanges of nitrogen cylinders can be reduced, and the running cost and the throughput can be optimized as a whole by changing a gas to be circulated according to the photosensitivity conditions, such as kinds of photoresists.

When the photoresist requires a relatively small amount of exposure as in the latter case, air taken in from the outside (outside air) may be used as it is in place of ozone-free air.

It is also possible to use, in place of nitrogen gas, another gas (e.g. an inert gas and the like such as helium) having a low absorptance and low refractive index with respect to excimer laser light. For example, when an asperical lenses are disposed also in the illumination system unit 110 like the projection optical system PL, the number of lenses to be used is reduced and the space in the illumination system unit 110 becomes wider than before, and therefore, there is an adverse possibility that the illumination system is susceptible to wandering of image due to a temperature variation. An image processing system for measuring positions of a pattern on the reticle R disposed in the reticle stage system unit 111 and the fiducial mark on the fiducial mark member FM, and the alignment sensor 28 disposed in the wafer stage system unit 113 also have space between themselves and marks to be detected. Therefore, there is an adverse possibility that an image may be wandered due to a temperature variation, an image may be shifted laterally due to an atmospheric pressure variation, or a focus position may be varied. Therefore, when helium gas is purged in the illumination system unit 110, the light source stage system unit 111 and the wafer stage system unit 113, there is a merit that affect of the image wandering due to the temperature variation can be suppressed, and the stability of the alignment sensor 28 is enhanced.

In this embodiment, gas is supplied in parallel to the illumination system unit 110, the reticle stage system unit 111, the wafer stage system unit 113 and the wafer transfer system unit 114, but all of the units or a part of the units may be connected in series with one another through piping, and gas may be supplied to the connected units in series, thereby simplifying the arrangement of the piping.

In this embodiment, the amount of illuminating light is controlled by utilizing the absorption of illuminating light by the above-mentioned gas. The light quantity control method will be described below with reference to FIGS. 8A and 8B.

Figure 8A:
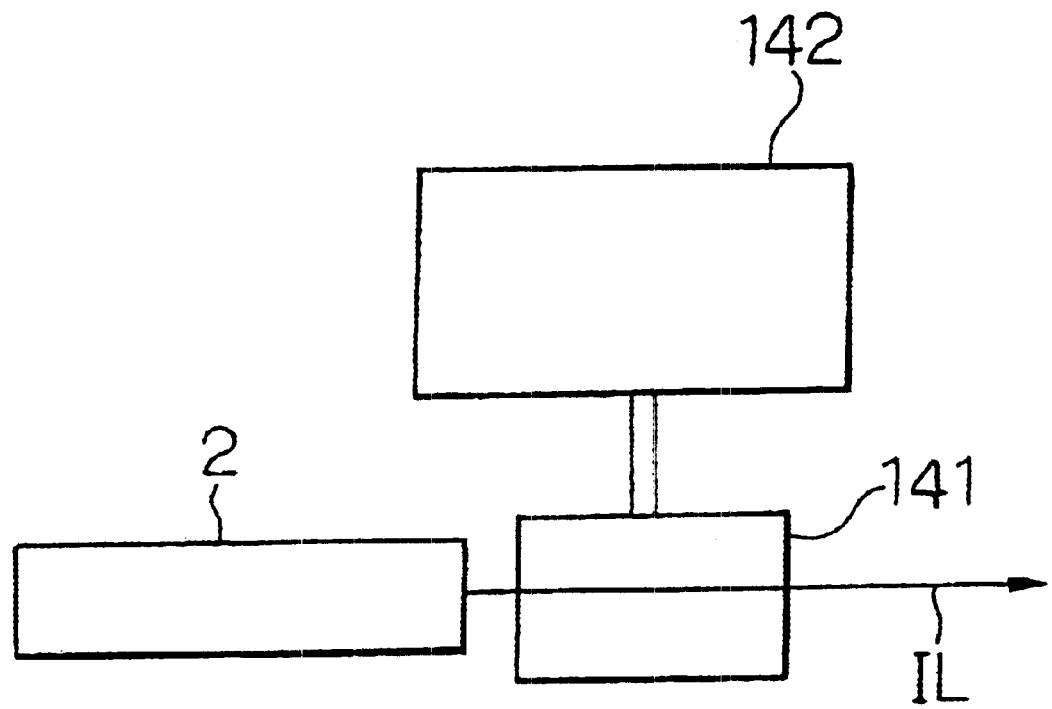
FIGS. 8A and 8B are views showing portions of the excimer laser light source 2 and the first illumination system 4 shown in FIG. 1.

FIG. 8A shows the excimer laser light source 2 and a part of the first illumination system 4 (the deflection mirror 3 is omitted), which are shown in FIG. 1. In FIG. 8A, illuminating light IL from the excimer laser light source 2 passes through a container 141 which has light-transmitting windows provided in both side faces thereof and which is supplied therein with a predetermined gas. In this embodiment, the container 141 is supplied with a gas (e.g. air) containing ozone ($O_3$) at a predetermined concentration through a piping (not shown). The container 141 is connected with a bellows mechanism 142. The amount of extension and contraction of the bellows mechanism 142 is controlled by the exposure controller 1 through the switching device 6, which are shown in FIG. 1, thereby enabling the pressure of the gas in the container 141, that is, the absorptance with respect to the illuminating light IL, to be continuously controlled in a predetermined range. More specifically, when it is desired to reduce the amount of illuminating light IL, the pressure of the gas in the container 141 is increased to raise the absorptance of the gas. When the light quantity is desired to increase, the pressure of the gas in the container 141 is reduced as far as a level close to a vacuum. Consequently, the transmittance increases, and thus a high power can be obtained. This method enables the light quantity to be continuously varied and minimizes damage to the control mechanism in contrast to a case where an ND filter is used.

It should be noted that the gas in the container 141 and the bellows mechanism 142 may be replaced in a predetermined proportion at a time because it is likely that the absorption of illuminating light by ozone will be saturated.

Figure 8B:
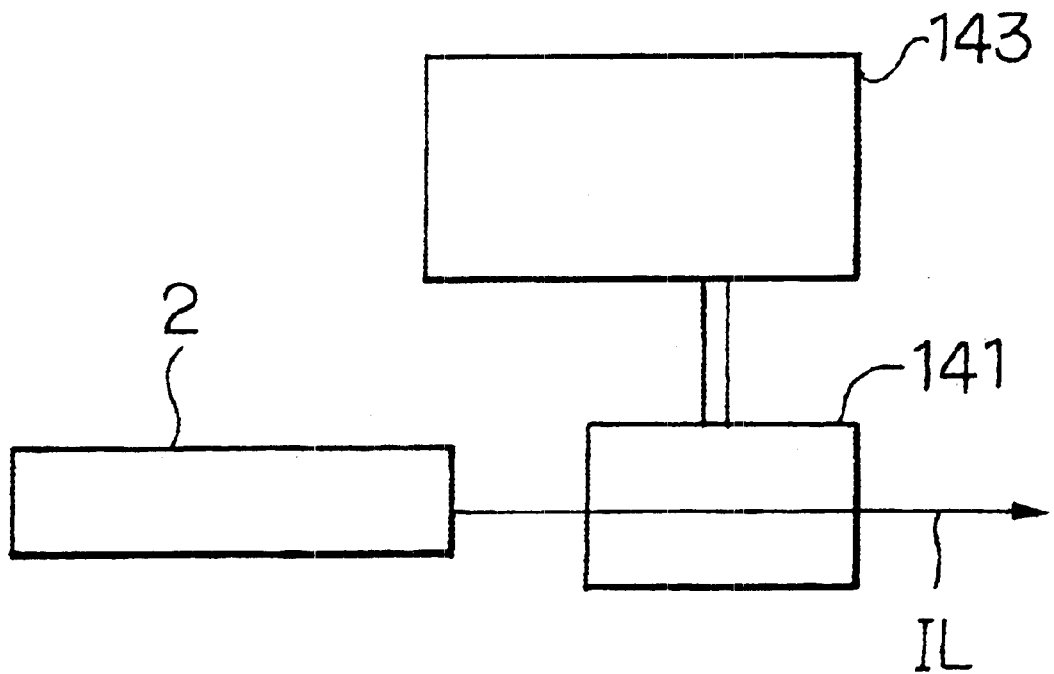

FIG. 8B shows an example of changing the concentration of ozone in the gas. In FIG. 8B, illuminating light IL emitted from the excimer laser light source 2 passes through the container 141. In this example, the container 141 is supplied therein with a gas (e.g. air) wherein the ozone concentration is controlled in the range of from 0 to 100% through a concentration varying mechanism 143. To increase the amount of illuminating light IL, the ozone concentration is reduced toward 0%, whereas to reduce the amount of illuminating light IL, the ozone concentration is increased toward 100%, thereby enabling the amount of illuminating light IL to be continuously controlled. When this system is used, the container 141 must be cooled because of heat generation by absorption of illuminating light. However, the system shown in FIG. 8B is advantageous, as in the case of FIG. 8A, in that the light quantity can be continuously varied, and that damage to the control mechanism is minimized in contrast to a case where an ND filter is used.

It should be noted that in the system shown in FIGS. 8A and 8B, a gas that absorbs excimer laser light, e.g. oxygen ($O_2$), may be used in place of ozone.

Next, support mechanisms for each part of the projection exposure apparatus according to the present embodiment will be described with reference to FIG. 9.

FIG. 9 schematically shows the arrangement of a mechanical part of the projection exposure apparatus according to this embodiment. In FIG. 9, a surface plate 23 for wafer stage is mounted over a large rectangular surface plate 32 through four vibration isolating mechanisms 33A to 33D (only 33A, 33B and 33C are shown in FIG. 9). A four-legged column 34 is stood on the surface plate 23. The wafer stage 22 and the sample table 21 and the like are mounted on the surface plate 23 (See FIG. 1). The reticle stage 17 and the reticle R are mounted on the upper plate 34a of the column 34 through the reticle support 18. The movable blind in the illumination field stop system 11 in the illumination optical system shown in FIG. 1 is fixed to the tip end portion of a supporting member 34b protruding above the upper plate 34a of the column 34. That is, in this embodiment, all of the members which move in synchronism with one another during the scanning exposure are directly or indirectly mounted on the surface plate 23 supported by the vibration isolating mechanism 33A to 33D through the column 34.

A four-legged second column 25 is stood through four vibration isolating mechanisms 35A to 35D (only 35A and 35C are shown in FIG. 9) outside the vibration isolating mechanisms 33A to 33D on the surface plate 32. The intermediate plate 25c passes a space between the upper plate 34a of the column 34 and the upper surface of the surface plate 23. An upper plate 25d of the column 25 is provided over the upper plate 34a of the column 34.

Each of the vibration isolating mechanisms 33A to 33D is a mount of high rigidity, including a driving element such as a piezoelectric element and having a sufficient power for absorbing a reaction force generated by driving the stage system at the time of scanning and exposing operation, and each the vibration isolating mechanisms can control the vibration up to high frequency.

The vibration isolating mechanism 35A to 35D are each active-type vibration isolating mechanism including an air pad and an electromagnetic damper for vibration damping. The projection optical system PL is secured in the intermediate plate 25c of the column 25. A casing 36 of the illumination optical system is mounted on the upper plate 25d of the column 25. The illumination optical system including the excimer laser light source 2 through the third illumination system 14, shown in FIG. 1, is secured on the upper plate 25d within the casing 36. It should, however, be noted that only the movable blind of the illumination field stop system 11 in the illumination optical system is secured to the distal end portion of the support member 34b of the column 34, which is inserted into the casing 36 through a window 36a. In other words, portions that are stationary during scanning exposure are mounted on the column 25 supported by the vibration isolating mechanisms 35A to 35D. It is preferable to mount the excimer laser light source 2 at a side or in a downstairs room and the like of the main body of the projection exposure apparatus separately therefrom.

Of these isolating mechanisms, the vibration isolating mechanisms 35A to 35D, which support the stationary members, mainly effects control for damping vibrations from the floor. The vibration isolating mechanisms 33A to 33D, which support the members movable during scanning exposure, effects control for damping vibration from the floor and for absorbing reaction force of the reticle stage 17 and the wafer stage 22 during scanning exposure.

Further, the focus and the leveling position of the column 34 are controlled with respect to the focus or the leveling control on the side of the column 25, and control for positioning the pattern surface of the reticle with respect to the projection optical system is carried out. A heavy member which is driven with high acceleration is not mounted to any of the vibration isolating mechanisms 35A to 35D which support stationary members during scanning and exposing operation. However, since the lens barrel of the projection optical system PL is largely divided into two pieces, it is necessary to control the vibration with high precision. Therefore, in the projection exposure apparatus of the present embodiment, the vibration is controlled such that a deformation error is not generated in the projection optical system PL, and relative errors between the column 25 and the column 34 can be controlled with high precision on the side of the column 34.

By supporting the portions which moves synchronously with one another and the stationary portions using different vibration isolating mechanisms, respectively, it is possible to optimize the vibration isolating mechanisms in accordance with a purpose, and to perform exposures while aligning the reticle R and the wafer W with high precision. In the projection exposure apparatus of the present embodiment, since the vibration is controlled with respect to the vibration in a slow cycle in the focus direction (direction Z), a focus/leveling detection sensor (not shown) for detecting a distance from the reticle R to the pattern surface and the multipoint AF sensor 26 (See FIG. 1) for always detecting a variation in distance to the surface of the wafer W are fixed on the side of the column 25.

The reticle stage 17 and the wafer stage 22 are each supported with respect to the surface plate 223 directly or indirectly through an air guide and driven by a linear motor operation. Therefore, although the surface plate 223 itself vibrates in response to vibrations due to high-frequency disturbance from the floor, it is unlikely that the high-frequency disturbance will be transmitted to the reticle stages 17 and the wafer stage 22. Accordingly, the air pads in the vibration isolating mechanisms 33A to 33D need not be of particularly high accuracy.

In FIG. 1, the wafer-side laser interferometer 24 actually includes laser interferometers for a plurality of axes in the directions X and Y. Similarly, the reticle-side laser interferometer 19 actually includes laser interferometers for a plurality of axes in the directions X and Y. The moving mirrors 19m and 24m also each represent moving mirrors for the X- and Y-axes. FIG. 9 shows two axes laser interferometers 19Y1 and 19Y2 for the Y-axis (scanning direction) in the reticle-side laser interferometer 19, and a one axis laser interferometer 24Y1 for the Y-axis in the wafer-side laser interferometer 24, together with a reticle-side moving mirror 19mY for the Y-axis.

The wafer-side laser interferometer 24Y1 for the Y-axis is secured to a leg portion of the column 25. The reticle-side laser interferometers 19Y1 and 19Y2 for the Y-axis are secured between the upper plate 25d and leg portions of the column 25. Similarly, the other laser interferometers for the Y-axis are also secured to the column 25. Thus, all the laser interferometers for the Y-axis are mounted on the column 225, which supports stationary members. The laser interferometers for the X-axis need not be mounted on the column 25. The laser interferometers for the X-axis may be mounted on the frame (not shown) or the like provided on a side face of the column 25.

In the above embodiment, the present invention is applied to the step-and-scan projection exposure apparatus, but the invention can also be applied to a full field exposure type projection exposure apparatus such as a stepper. As a gas for allowing the exposure beam to pass, hydrogen gas ($H_2$) can also be used. Although hydrogen gas must be handled more carefully as compared with the helium, hydrogen gas is less expensive than helium.

The present invention is especially effective when ultraviolet light having wavelength of 300 nm to 100 nm is used as the exposure beam. That is, if the wavelength is about 300 nm or longer, since the amount of light absorbed by ozone is not so much, even if air from which ozone is removed is supplied into the projection optical system, a substantially desired amount of exposure can be obtained even if concentration of the ozone is not controlled so strictly. Further, the necessity for air-tightly closing the periphery of the lens driving mechanism is low. On the other hand, since most portions of the optical path for the exposure beam needs to be evacuated into substantially vacuum state, the necessity for supplying predetermined gas especially into the projection optical system becomes also low.

In the above embodiment, the double-barreled catadioptric system is used as the projection optical system PL. The present invention can also be applied to a case in which a straight-barreled catadioptric system comprising a plurality of refractors and two concave mirrors each having an opening in the vicinity of one optical axis, all of which optical elements are arranged along the one optical axis, as disclosed, e.g., in Japanese Patent Application No. 10-370143 and No.11-66769, the disclosures of which are herein incorporated by reference, is used as the projection optical system PL. The straight-barreled catadioptric system has the advantage in that many of designs and producing techniques of the conventional catadioptric straight-barreled projection optical system can be utilized. The straight-barreled catadioptric system is also disclosed in Japanese Patent Application Laid-open No.10-104513, U.S. Pat. Nos. 5,559,338 and 5,650,877, the disclosures of which are herein incorporated by reference.

Although the catadioptric system is used as the projection optical system PL in the above embodiment, a refracting system or a reflecting system may be used depending upon requirements or exposure wavelength for example. Further, the projection optical system PL is not limited the image-reduction system, and the system PL may be the 1:1 optical system or the image-enlarging system.

The present invention can also be applied to a proximity exposure apparatus in which a mask and a substrate are closely disposed and a pattern of the mask is exposed to light. That is, when the present invention is applied, when there is provided a driving mechanism for moving a part of the illuminating optical system, i.e., at least one of the plurality of optical elements disposed between the light source 2 and the reticle R, at least a portion of the driving mechanism may be disposed in a cover for isolating that portion from outside air as shown in FIGS. 4A and 4B. This, even in the exposure apparatus includes the projection optical system as in the above embodiment, can be applied to the illuminating optical system thereof. All the driving mechanism for moving optical elements of the illuminating optical system or the projection optical system may be disposed in the cover. However, in order to reduce the space in the cover into which the helium gas is supplied, or to prevent materials (degas or the like), which varies the transmittance, the illuminance, the illuminance distribution, the optical characteristics, generated from the driving mechanism from being generated, members to be disposed in the cover is reduced in number to a minimum. For example, it is preferable that the driving source (motor) and the like are disposed outside the cover, if possible.

A purpose of the exposure apparatus is not limited to an exposure apparatus for producing semiconductor devices, and the invention can widely be applied to an exposure apparatus in which liquid crystal display elements or plasma display elements are produced on a rectangular glass plate by exposure, and an exposure apparatus for producing a thin film magnetic head or an image pickup device (CCD or the like).

Further, the present invention can also be applied to an exposure apparatus in which parent patterns obtained by dividing an enlarged pattern of a device pattern to be formed on a reticle into a plurality of pieces are formed on master reticles, and demagnified images of the parent patterns are transferred, using a step and stich method, onto a master or original plate which is to be a reticle to form one device pattern, thereby producing a working reticle (photomask). In this exposure apparatus for producing reticles, far ultraviolet light or vacuum ultraviolet light is used as exposure illuminating light.

Further, as a exposure light source, instead of the excimer laser of the like, a laser device in which single wavelength laser light of infrared wavelength region or visible wavelength region oscillated from a DFB (Distributed Feed back) semiconductor laser or a fiber laser is amplified by a fiber amplifier doped with erbium (Er) (or both erbium and ytterbium (Yb)), and the amplified laser light is wavelength-converted to generate a harmonic of ultraviolet light using nonlinear optical crystal, may be used.

For example, if the oscillation wavelength of a single wavelength laser is in a range of 1.544 to 1.553 $\mu$m, ultraviolet light of an eighth-order harmonic having a wavelength within a range of 193 to 194 nm, i.e., which is substantially the same wavelength as that of the ArF excimer laser, can be obtained. If the oscillation wavelength of a single wavelength laser is in a range of 1.57 to 1.58 $\mu$m, ultraviolet light of a tenth-order harmonic having a wavelength within a range of 157 to 158 nm, i.e., which is substantially the same wavelength as that of the $F_2$ laser, can be obtained.

When the exposure apparatus of the above-mentioned embodiment is produced, the illumination optical system and the projection optical system comprising a plurality of optical members are assembled into the exposure apparatus body, then an optical adjustment is performed, the light source stage and the wafer stage comprising a large number of mechanical parts are mounted to the exposure apparatus body, and wiring and piping are connected. Then, the supply apparatus for high transmittance gas is mounted, total adjustments (electrical adjustment, operation check and the like) are carried out, and the exposure apparatus of the present embodiment can be produced. It is preferable to produce the exposure apparatus in a clean room in which a temperature and a degree of cleanliness are controlled.

A semiconductor device is produced through a step for designing function and performance of the device, a step for producing a reticle based on the former step, a step for producing a wafer from silicon material, a step for exposing a pattern of the reticle onto the wafer by the projection exposure apparatus of the above-described embodiments, a step for assembling the device (including a dicing step, a bonding step and a packaging step), a step for inspection, and the like.

According to the above-mentioned exposure method according to the first aspect of the present invention, air-tightness of the interior of the projection optical system is enhanced by providing the isolating member which isolates the image-forming characteristics control member which controls the predetermined image-forming characteristics of the projection optical system from outside air of the projection optical system. Therefore, when a gas through which the exposure beam is allowed to pass is supplied to the inside of the isolating member and around the optical member during exposure, a variation in a temperature or a purity of the gas in the projection optical system is reduced, and as a result, it is possible to suppress the deterioration of the image-forming characteristics and to maintain the excellent image-forming characteristics.

According to the above-mentioned exposure method according to the second aspect of the present invention, at least one of the purity and the temperature of the gas having an excellent transmittance in the projection optical system is substantially continuously measured, and based on a result of this measurement, the purity or the temperature of the gas through which the exposure beam in the projection optical system is allowed to pass is maintained within the predetermined tolerance range. Therefore, it is possible to prevent transmittance from being lowered or to suppress the deterioration of the image-forming characteristics.

According to the above-mentioned exposure apparatuses according to the present invention, the exposure methods according to the present invention can be carried out.

According to the device manufacturing method according to the present invention, the deterioration of the image-forming characteristics can be suppressed, resulting in mass production of high-performance semiconductor devices and the like. Further, because the transmittance of the exposure beam can be prevented from deteriorating, the devices can be manufactured at a high throughput.

The entire disclosure of Japanese Patent Application No. 10-1333343 filed on May 15, 1998 including specification, claims, drawings and summary are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An exposure apparatus which irradiates a pattern of a mask with an exposure beam to transfer an image of said pattern of said mask onto a substrate, comprising:

an optical member which is disposed on an optical path of said exposure beam and is accommodated in a lens barrel;

a driving mechanism which is connected with said optical member, a portion of which is provided on said lens barrel, and which adjusts a position of said optical member, a cover which is mounted to said lens barrel and which covers said portion of said driving mechanism;

a gas supply system which is connected with said lens barrel and which supplies a predetermined gas into said lens barrel; and a gas discharge system which is connected with said cover and which discharges said predetermined gas from said lens barrel.

2. An exposure apparatus as recited in claim 1, further comprising:

a sensor which is connected with said lens barrel and which substantially continuously detects at least one of a purity and a temperature of said gas in said lens barrel; and a controller which is connected with said sensor and which controls said gas supply system based on a detection result of said sensor to maintain said at least one of the purity and the temperature of said gas in said lens barrel within a predetermined tolerance range.

3. An exposure apparatus as recited in claim 1, wherein said portion of said driving mechanism is connected with said optical element and at least one driving element is provided on a side face of said lens barrel.

4. An exposure apparatus as recited in claim 3, further comprising an irradiation source which emits said exposure beam, wherein said lens barrel is disposed between said irradiation source and said substrate.

5. An exposure apparatus as recited in claim 4, wherein said optical member constitutes a portion of a projection optical system which transfers said pattern of said mask onto said substrate, and said lens barrel accommodates said projection optical system.

6. An exposure apparatus as recited in claim 5, wherein said optical member is one of a plurality of optical elements which constitute said projection optical system.

7. An exposure apparatus as recited in claim 6, wherein said at least one driving element adjusts image-forming characteristics of said projection optical system by moving or tilting said optical member in an optical axis direction.

8. An exposure apparatus as recited in claim 7, wherein said predetermined gas is discharged from said lens barrel through said driving element.

9. An exposure apparatus as recited in claim 8, wherein said driving mechanism is connected with said optical member and includes a driving source which gives a driving force to the at least one driving element, and said driving source is disposed outside said cover.

10. An exposure apparatus as recited in claim 3, wherein said at least one driving element comprises three driving sub-elements disposed at a periphery of said optical member at regular intervals.

11. An exposure apparatus as recited in claim 3, wherein optical member constitutes a portion of an illuminating optical system which irradiates an illumination light from an irradiation source onto said mask, and said lens barrel accommodates said illuminating optical system.

12. An exposure apparatus as recited in claim 1, wherein said cover is detachably provided with respect to said lens barrel.

13. An exposure apparatus as recited in claim 4, wherein said optical path of said exposure beam between said irradiation source and said substrate is divided into a plurality of sub-optical paths, and kinds of said predetermined gas respectively supplied to said plurality of sub-optical paths are different from each other.

14. An exposure apparatus as recited in claim 13, wherein a kind of said predetermined gas to be supplied to an interior of said lens barrel when exposure is performed and a kind of said predetermined gas to be supplied to the interior of said lens barrel when exposure is not performed are different.

15. An exposure apparatus as recited in claim 3, wherein kinds of said predetermined gas to be supplied to the interior of said lens barrel is switched in accordance with exposure conditions.

16. An exposure apparatus as recited in claim 1, wherein when a wavelength of said exposure beam is within a range of 200 to 100 nm, said gas supply system supplies nitrogen gas or helium gas as said predetermined gas into said lens barrel.

17. An exposure apparatus which irradiates a mask with an exposure beam emitted from an irradiation source to expose a substrate with said exposure beam through said mask, comprising:

an optical member which is disposed between said irradiation source and said substrate and is accommodated in a lens barrel;

a driving mechanism which is connected with said optical member, a portion of which is provided on said lens barrel, and which drives said optical member; and a cover which is detachably provided on a side face of said lens barrel, and which cuts off communication between an interior of said lens barrel and outside air through said portion of said driving mechanism.

18. An exposure apparatus as recited in claim 17, further comprising:

a gas supply system which is connected with said lens barrel and which supplies a predetermined gas into said lens barrel; and a gas discharge system which is connected with said cover and which discharges said predetermined gas from said lens barrel.

19. An exposure apparatus as recited in claim 18, further comprising:

a sensor which is connected with said lens barrel and which substantially continuously detects at least one of a purity and a temperature of said predetermined gas in said lens barrel; and a controller which is connected with said sensor and which controls the gas supply system based on a detection result of said sensor to maintain at least one of the purity and the temperature of said predetermined gas in said lens barrel within a predetermined tolerance range.

20. An exposure apparatus as recited in claim 18, wherein said lens barrel is disposed between said irradiation source and said substrate.

21. An exposure apparatus as recited in claim 20, wherein said optical member constitutes a portion of a projection optical system which transfers a pattern of said mask onto said substrate, and said lens barrel accommodates said projection optical system.

22. An exposure apparatus as recited in claim 21, wherein said optical member is one of a plurality of optical elements which constitute said projection optical system.

23. An exposure apparatus as recited in claim 22, wherein said driving mechanism adjusts image-forming characteristics of said projection optical system by moving or tilting said optical member in an optical axis direction.

24. An exposure apparatus as recited in claim 20, wherein said optical member constitutes a portion of an illuminating optical system which irradiates an illumination light from said irradiation source onto said mask, and said lens barrel accommodates said illuminating optical system.

25. An exposure apparatus as recited in claim 17, wherein said portion of said driving mechanism is connected with said optical element and includes a driving element which is provided on a side face of said lens barrel.

* * * * *